(12) United States Patent
Lee et al.

(10) Patent No.: US 7,572,343 B2
(45) Date of Patent: Aug. 11, 2009

(54) COMPOSITE METAL MATRIX CASTINGS AND SOLDER COMPOSITIONS, AND METHODS

(75) Inventors: Andre Y. Lee, Novi, MI (US); Karatholuvu N. Subramanian, Brighton, MI (US)

(73) Assignee: Board of Trustees of Michigan State University, East Lansing, MI (US)

( * ) Notice: Subject to any disclaimer, the term of this patent is extended or adjusted under 35 U.S.C. 154(b) by 734 days.

(21) Appl. No.: 10/910,810

(22) Filed: Aug. 3, 2004

(65) Prior Publication Data

US 2005/0034791 A1   Feb. 17, 2005

Related U.S. Application Data

(60) Provisional application No. 60/492,806, filed on Aug. 6, 2003.

(51) Int. Cl.
*B23K 35/34* (2006.01)
(52) U.S. Cl. .......................................... 148/23; 148/400
(58) Field of Classification Search ................. 148/400, 148/23
See application file for complete search history.

(56) References Cited

U.S. PATENT DOCUMENTS

| | | | | |
|---|---|---|---|---|
| 1,926,853 | A | * | 9/1933 | Callis et al. ................ 420/557 |
| 2,473,887 | A | * | 6/1949 | Jennings et al. ............. 228/215 |
| 3,503,721 | A | * | 3/1970 | Lupfer ....................... 428/633 |
| 4,541,876 | A | * | 9/1985 | Hwang ........................ 148/22 |
| 4,607,780 | A | * | 8/1986 | Philipoussi ................. 228/118 |
| 4,661,173 | A | * | 4/1987 | Barajas et al. ................ 148/24 |
| 5,127,969 | A | | 7/1992 | Sekhar |
| 5,234,506 | A | | 8/1993 | Winston et al. |
| 5,333,668 | A | | 8/1994 | Jorstad et al. |
| 5,346,723 | A | * | 9/1994 | Hoag et al. ................. 427/302 |
| 5,738,269 | A | * | 4/1998 | Masterton ................ 228/248.1 |
| 5,858,544 | A | * | 1/1999 | Banaszak Holl et al. .... 428/447 |
| 5,866,044 | A | | 2/1999 | Saraf et al. |
| 5,928,404 | A | | 7/1999 | Paruchuri |
| 6,006,819 | A | | 12/1999 | Shimizu et al. |
| 6,284,696 | B1 | | 9/2001 | Koya et al. |
| 6,340,113 | B1 | | 1/2002 | Avery et al. |
| 6,443,211 | B1 | | 9/2002 | Myers |
| 6,465,387 | B1 | | 10/2002 | Pinnavaia et al. |
| 6,484,790 | B1 | | 11/2002 | Myers |
| 6,521,176 | B2 | | 2/2003 | Kitajima et al. |
| 6,569,252 | B1 | | 5/2003 | Sachdev et al. |
| 6,770,724 | B1 | | 8/2004 | Lichtenhan et al. |
| 6,936,663 | B1 | | 8/2005 | Modisette |
| 2003/0047034 | A1 | | 3/2003 | Ono et al. |
| 2003/0055193 | A1 | | 3/2003 | Lichtenhan et al. |

OTHER PUBLICATIONS

J.G. Lee, K.C. Chen, K.N. Subramanian, "Formation and Growth of Intermetallics around Metallic Particles in Eutectic Sn-Ag Solder", Journal of Electronic Materials, vol. 32, No. 11, 2003.
International Preliminary Report on Patentabillity—Form PCT/IPEA/409—3 pages.
International Search Report—Form PCT/ISA/210—2 pages.
Written Opinion of the International Searching Authority—Form PCT/ISA/237—4 pages.
McCormack, S. Jin, et al, "Enhanced Solder Alloy Performance by Magnetic Dispersions", IEEE Transactions on Components, Packaging, and manufacturing Technology- Part !, 17 (3), pp. 452-457 (1994).
Mavoori, H., et al., J. Electr. Mater. 27(11) pp. 1216-1222 (1998).
Miller, C.M., et al., J. Electr. mater. 23(7), pp. 595-601 (1994).
Guo, F., et al., "Evaluation of Creep Behavior of Near Eutectic Sn-Ag Solders Containing Small Amount of Alloy Additions", Materials Science and Engineering, A351, pp. 190-199, (2003).
Lee, J.G., et al., "Residual Mechanical Behavior of Thermomechanically Fatigued Sn-Ag Based Solder Joints", J. Electr. Mater., 31(9), pp. 946-952 (2002).
Wu, C.M.L., et al., "The Wettability and Microstructure of Sn- Zn-RE Alloyws", J. Electr. Mater., 32(2): pp. 63-69 (2003).
Wu, C.M.L., et al., "Improvements of Microstructure, Wettability, Tensile and Creep Strength of Eutectic Sn-Ag Alloy by Doping with Rare-Earth Elements", Journal of Materials Research, 17(12), pp. 3146-3154 (2002).
J. Am. Chem. Soc. 111 1741-1748 (1989).
Organometallics 10 2526-2528 (1991).

* cited by examiner

*Primary Examiner*—Roy King
*Assistant Examiner*—Jessee R. Roe
(74) *Attorney, Agent, or Firm*—Ian C. McLeod

(57) ABSTRACT

A composite composition and methods for making the composition, providing a metal matrix and dispersed inorganic oxide particles with a bound organofunctional group on a surface of the particles are described. A composite solder composition and methods for making and using the composition, providing a metal matrix and dispersed inorganic oxide particles with a bound organofunctional group on a surface of the particles are described. An apparatus comprising this composite solder composition is also described. In particular, organofunctional POSS, and POS, particles are described. The compositions provide cast metals and solders.

73 Claims, 44 Drawing Sheets

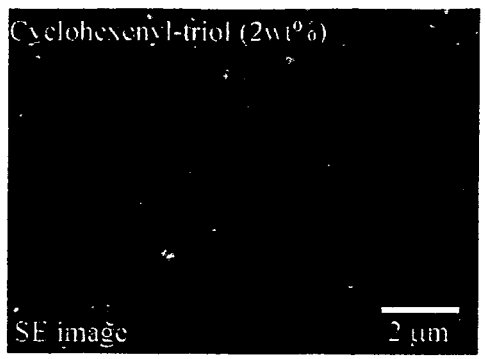 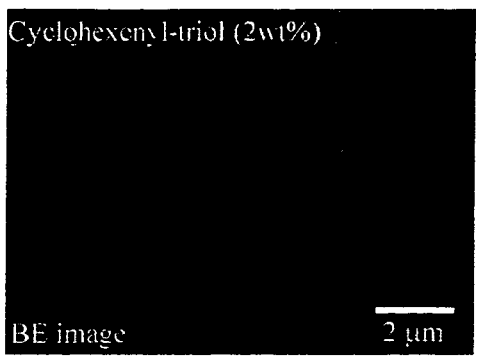
Fig. 35A  (Cyclohexenyl-triol)  Fig. 35B
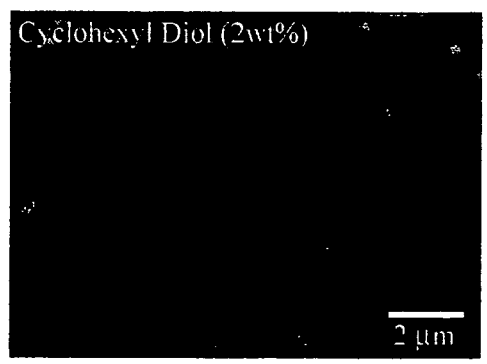 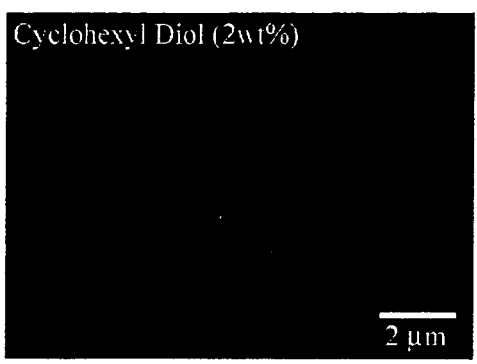
Fig. 35C  (Cyclohexyl Diol)  Fig. 35D
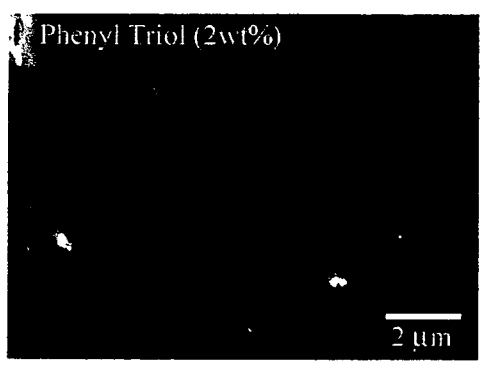 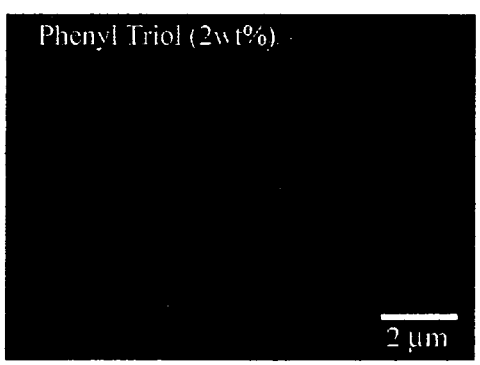
Fig. 35 E (Phenyl-Triol)  Fig. 35F
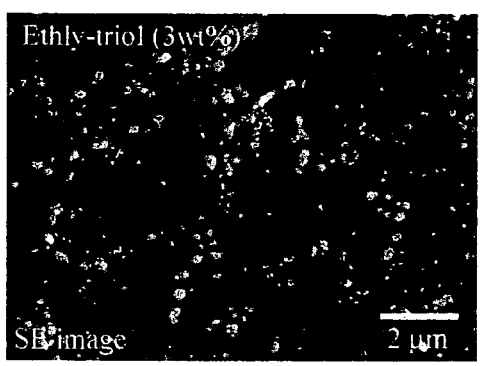 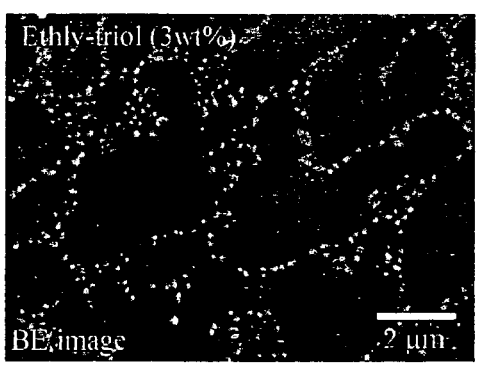
Fig. 35G  (Ethyl-Triol)  Fig. 35H

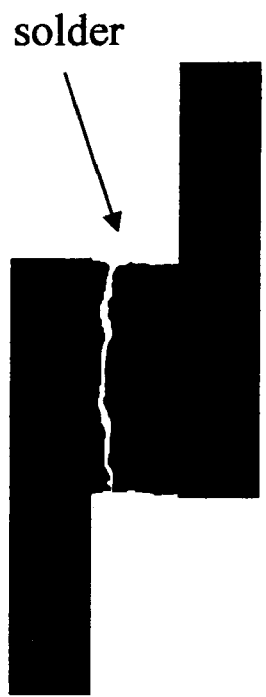
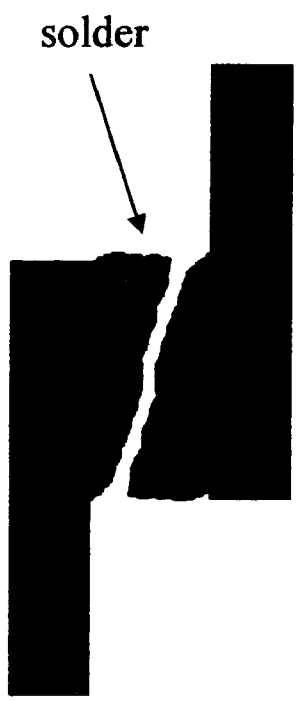
Fig 41A eutectic Sn-Ag
Fig. 41B POSS containing composite solder

 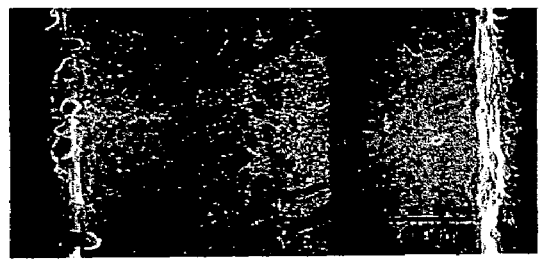
Fig. 44A  0 cycle          Fig. 44B  250 cycles
 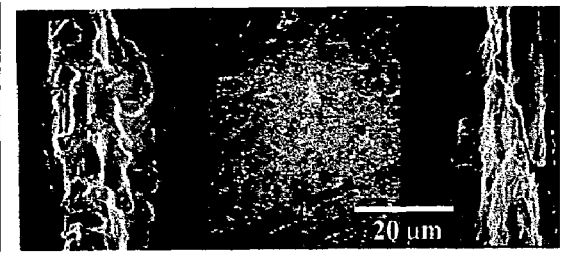
Fig. 44C  500 cycle        Fig. 44D  1000 cycles

Fig. 45A  0 cycle
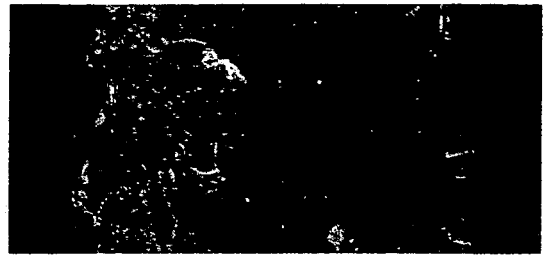
Fig. 45B  250 cycles
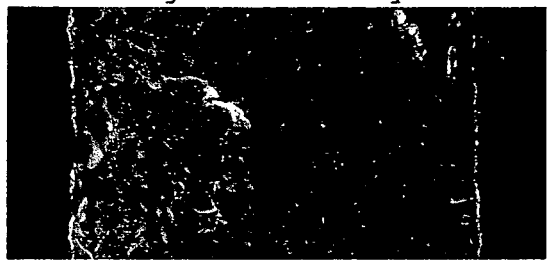
Fig. 45C  500 cycle
Fig 45D  1000 cycles

Fig. 46A  0 cycle
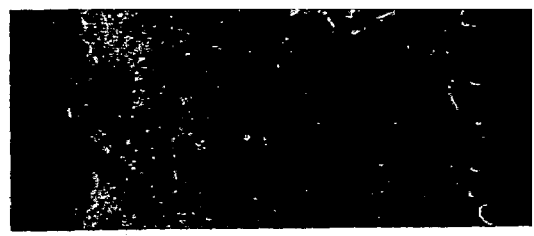
Fig. 46B  250 cycles
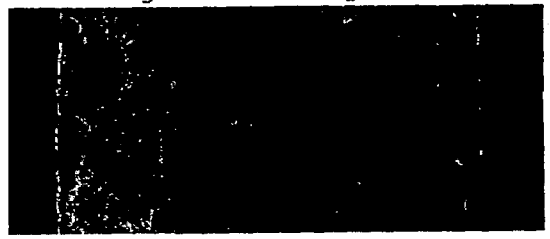
Fig. 46C  500 cycle
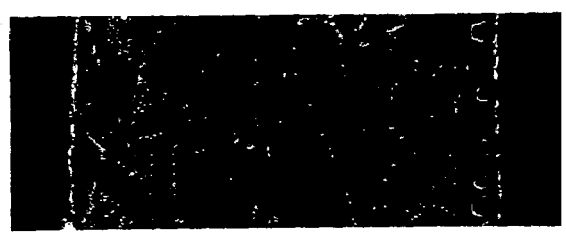
Fig. 46D  1000 cycles

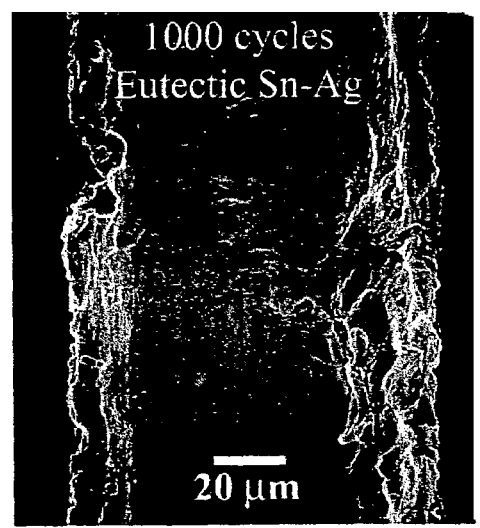
Fig. 47A  eutectic Sn-Ag
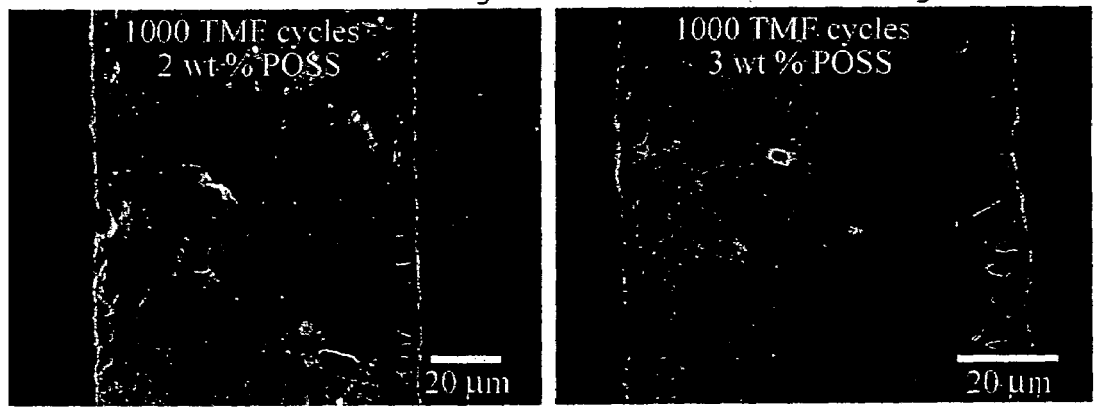
Fig. 47B  2 wt% POSS
Fig. 47C  3 wt% POSS ● Intermetallic Particle
τ Shear Stress
a Area of Lattice Deformation

COMPOSITE METAL MATRIX CASTINGS AND SOLDER COMPOSITIONS, AND METHODS

This application claims the benefit of U.S. Provisional Application(s) No(s).: 60/492,806 Aug. 6, 2003.

BACKGROUND OF THE INVENTION (1) Field of the Invention

The present invention relates generally to composite castings and solders including brazing, and more particularly the present invention relates to composite castings and solders which contain organofunctional inorganic oxide particles. The invention further relates to a lead-free composite solder.

(2) Description of the Related Art

Light weight castings are increasingly used as substitutes for cast iron for reducing weight. Castings have many uses, especially in the automotive and aerospace industries. Often the light weight castings do not have the performance or reliability of the iron castings. One approach to this problem is to provide high strength inserts at critical stress points in the light weight castings.

U.S. Pat. Nos. 6,484,790 and 6,443,211 to Myers, et al. teach a method for forming light-weight composite metal castings incorporating metallurgically bonded inserts for a variety of applications. A casting method includes the step of coating the insert with a first layer under conditions including sufficient temperature to cause a portion of the layer to be sacrificed by dissolving into the cast metal material while leaving at least a portion of the first layer as a diffusion barrier between the insert and the cast material.

U.S. Pat. No. 6,006,819 to Shimizu, et al. teaches an aluminum-based composite member having an increased strength of bond between an aluminum-based body and a cast iron material portion which is incorporated into the aluminum-based body by casting.

U.S. Pat. No. 5,333,668 to Jorstad, et al. teaches a process for coating a ferrous or aluminum article, such as an engine cylinder liner insert, to provide a metallurgical bond with aluminum alloy material cast around the article.

Lead-free electronic solders are low melting alloy systems. However, their service performance in modern microelectronic applications requires that they have better thermomechanical (TMF) capabilities, good dimensional stability, and reduced electromigration. Good TMF performance is important for automotive, aerospace/defense, and consumer electronic applications, since these situations involve severe thermal excursions. In typical microelectromechanical systems (MEMS), the dimensional stability of the interconnects becomes important, since the lines in printed circuit boards that carry electrical current are placed very close to each other. High current densities encountered in such MEMS, and current generating applications, warrant solutions for electromigration problems.

Composite solders are solders with intentionally incorporated reinforcements. There have been several attempts to incorporate compatible reinforcements in solder systems. Such methods include incorporation of intermetallic (IMC) reinforcements by in-situ or mechanical mixing methods. Mechanical mixing methods can incorporate IMC directly to the solder paste, or convert the metallic powder added to the paste to IMC by reacting with the molten solder during the reflow process. However, such reinforcements tend to be several microns in size. In addition, IMC reinforcements tend to coarsen during service and affect their effectiveness. Service performance improvements achieved by IMC reinforcements tend to be varied depending on the type of the IMC reinforcement, method used to incorporate such reinforcements, and their coarsening kinetics during service. As a consequence, IMC particulate reinforced composite solders have not been implemented in the actual electronic solder interconnects. With the rapid advance in the miniaturization of the electronic components a need for solders with sub-micron reinforcements has developed.

An alternate approach is to incorporate inert particulate reinforcements in the solder matrix. One such attempt is to incorporate iron particulate in the presence of a magnetic field (M. McCormack, S. Jin, and G. W. Kammlott, "Enhanced Solder Alloy Performance by Magnetic Dispersions", IEEE Transactions on Components, Packaging, and Manufacturing Technology—Part A, 17 (3), pp. 452-457, 1994.) Incorporation of ceramic particulates such as alumina in the electronic solders has also been attempted. One problem with this methodology is the agglomeration of the reinforcements during the reflow process making them to acquire larger sizes with pores. Attempts such as mechanical working by rolling to break up and disperse these agglomerated particulates have been tried with associated problems of interface cracking between the reinforcements and the matrix (H. Mavoori and S. Jin, "New Creep-Resistant, Low Melting Point Solders with Ultrafine Oxide Dispersions", J. Electr. Mater., 27(11): pp.1216-1222, 1998). Another serious problems associated with incorporation of such inert reinforcements is lack of any chemical bonding between the reinforcement and the solder matrix, which makes them not very effective to enhance the service performance (H. Mavoori and S. Jin). As a consequence such solders with inert reinforcements have not been implemented in practice.

Another approach that is vigorously pursued is alloying Sn—Ag based solders with small quantities Cu, Ni, rare-earth elements etc. (C. M. Miller, I. E. Anderson, and J. F. Smith, "A Viable Tin-Lead Solder Substitute: Sn—Ag—Cu", J. Electr. Mater., 23(7), pp.595-601, 1994., F. Guo, S. Choi, T. R. Bieler, J. P. Lucas, A. Achari, M Paruchuri and K. N. Subramanian, "Evaluation of Creep Behavior of Near Eutectic Sn—Ag Solders Containing Small Amount of Alloy Additions", Materials Science and Engineering, A351, pp.190-199, 2003, J. G. Lee, F. Guo, S. Choi, K. N. Subramanian, T. R. Bieler, and J. P. Lucas, "Residual Mechanical Behavior of Thermomechanically Fatigued Sn—Ag Based Solder Joints", J. Electr. Mater., 31(9), pp.946-952, 2002., C. M. L. Wu, C. M. T. Law, D. Q. Yu, and L. Wang, "The Wettability and Microstructure of Sn—Zn-RE Alloys", J. Electr. Mater., 32(2): pp.63-69, 2003., C. M. L. Wu, D. Q. Yu, C. M. T. Law, and L. Wang, "Improvements of Microstructure, Wettability, Tensile and Creep Strength of Eutectic Sn—Ag Alloy by Doping with Rare-Earth Elements", Journal of Materials Research, 17(12), pp.3146-3154, 2002). Although these ternary and quaternary alloy solders can produce binary and ternary IMC precipitates, it is difficult to control their size and distribution during the reflow process. Such alloying also alters the melting temperature affecting the reflow parameters warranting changes in processing parameters and methodologies.

With the rapid advance in the miniaturization of the electronic components a need for solders with sub-micron reinforcements becomes a necessity. Such sub-micron size reinforcements when present at the grain boundaries can minimize grain boundary sliding, the predominant mode of TMF damage, during the high temperature dwell in a TMF cycle, by keying the grain boundaries. Such an approach is employed in nickel and cobalt based super alloys used in high temperature service environments. These reinforcements can minimize the TMF damage and improve their service reliability, and also improve the dimensional stability that is essential for MEMs and microelectronics applications.

In microelectronic applications, as the current density increases the migration of ions between electrodes cause voiding that results in the failure of the solder joint. Similar issues in computer industry have been successfully tackled by incorporation of copper atoms in the grain boundaries of aluminum lines. However, there is no known solution for the same problem in the case lead-free solders. The sub-micron sized reinforcements that can result from the proposed method of reinforcing the solders can provide a solution to the electro migration problem.

U.S. Pat. No. 5,127,969 to Sekhar teaches a solder composition with a continuous phase and a disperse phase. The disperse phase is a reinforcing material in particulate or fibrous form comprising graphite, silicon carbide, a metal oxide, an elemental metal, and/or a metal alloy. The reinforcing material remains in particulate or fibrous form as a disperse phase. While Sekhar teaches particulate and fibrous reinforcements ranging from submicron to sixty microns, it does not teach of nano-sized particle reinforcements.

U.S. Pat. Nos. 5,928,404 and 6,360,939 to Paruchuri, et al. teach an electrical solder paste having primary solder powder and an additive metal powder component which does not melt during the soldering process due to it having a melting point substantially higher than the melting point of the primary powder.

U.S. Pat. No. 6,340,113 to Avery, et al. teaches solder compositions which are composed of particles of a first metal coated with a second metal, or a salt solution or suspension of a second metal. The metals are chosen such that their individual melting points are higher than the melting points of the alloys formed when they are combined. The coated particles are heated and melting occurs at the interfaces between the core materials and their coatings. The particles fuse together into a porous metal foam.

U.S. Pat. No. 6,521,176 to Kitajima, et al. teaches a lead-free solder alloy with respective concentrations set such that the lead-free solder alloy has a melting temperature lower than a predetermined heat-resistant temperature of a work to be soldered.

U.S. Pat. No. 5,866,044 to Saraf, et al. teaches an electrically conductive paste which includes a thermoplastic polymer, a conductive metal powder and an organic solvent system. The thermoplastic polymer is selected from the group consisting of a poly(imide urea), a poly(ether siloxane), a poly(styrene butadiene), a poly(styrene isoprene), a poly(acrylonitrile butadiene), a poly(ethylene vinyl acetate) and a polyurethane.

While the related art describes alternative ways to address improving service performances of solders, there is still a need for a superior solution to this long unsolved problem. Therefore, it is desirable to develop composite solder compositions with sub-micron reinforcements which have improved service performance. It is further desirable that composite solder compositions be free of lead. Environmental lead release is a growing concern considering the inherent toxicity of lead and the rapidly expanding utilization of electronic circuitry in all aspects of modern life. Solder compositions which reduce the amount of lead while retaining properties such as melting temperature, solderability, fatigue behavior, and processing parameters of lead solders would address a long unsolved problem of toxic waste disposal.

SUMMARY OF THE INVENTION

The present invention provides a composite composition comprising a metal matrix, and inorganic oxide particles with a chemically bound organofunctional group on a surface of the particle wherein the particles are dispersed in the metal matrix.

The invention also provides a process of preparing a composite composition comprising the step introducing inorganic oxide particles with a chemically bound organofunctional group on a surface of the particles into a molten metal, to produce a metal matrix with the particles dispersed in the metal matrix.

The invention further provides the previous compositions and processes, wherein the metal or alloy thereof melts at a temperature of less than about 600° C. In some embodiments of the previous compositions and processes, the metal is an alloy of metals. In some embodiments of the previous compositions and processes the metal is selected from the group consisting of Magnesium (Mg), Zinc (Zn), Cadmium (Cd), Aluminum (Al), Indium (In), Thallium (Tl), Tin (Sn), Lead (Pb), Bismuth (Bi), and mixtures thereof. In some embodiments the previous compositions and processes, the particles are selected from the group consisting of a POSS, a POS, and mixtures thereof. Some embodiments of the previous compositions and processes provide particles that are a POSS-triol with the formula $R_7Si_7O_9(OH)_3$ and the structure:

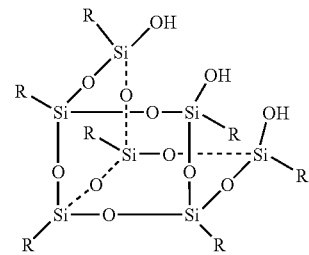

and R is the organofunctional group. In some embodiments of the previous compositions and processes, the particles are cyclohexyl POSS-triol, while in others the particles are phenyl POSS-triol.

The invention further provides a composite composition comprising a metal solder, and inorganic oxide particles with a chemically bound organofunctional group on a surface of the particles dispersed in the solder. In some embodiments, the solder is a paste which is melted to form the solder as a matrix with the particles dispersed in the matrix. In other embodiments, the solder is a solid preform of the solder with the solder as a matrix and the particles dispersed in the matrix.

The invention further provides embodiments of the composition, the solder melts at less than about 250° C. In other embodiments of the compositions, the solder is an alloy of metals. In some embodiments, the solder is lead-free. In some embodiments, the particles form a chemical bond with the solder. In some embodiments, the particle is a POSS-triol with the formula $R_7Si_7O_9(OH)_3$ and the structure:

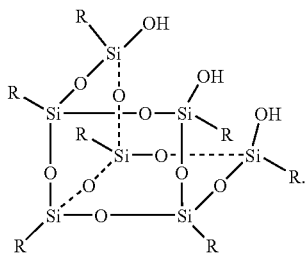

and R is the organo functional group. In some embodiments, the particles are cyclohexyl POSS-triol, while in others the particles are phenyl POSS-triol. In some embodiments of the composition, the metal is selected from the group consisting of tin (Sn), silver (Ag), copper (Cu), bismuth (Bi), zinc (Zn), indium (In), gold (Au), nickel (Ni), antimony (Sb), palladium (Pd), platinum (Pt), germanium (Ge), and mixtures thereof. In some embodiments, the metal matrix is Sn—Ag, and in further embodiments the metal matrix is a eutectic 96.5 wt % Sn -3.5 wt % Ag.

The invention further provides a process of preparation of a solder paste composition comprising the step of introducing inorganic oxide particles with a chemically bound organofunctional group on a surface of the particles into a particulate metal solder, and mechanically mixing the particle and metal solder to provide the paste.

The invention further provides a method of soldering comprising the steps of providing a composite composition comprising a metal solder with inorganic oxide particles with a chemically bound organofunctional group on a surface of the particles dispersed in the solder, and applying said solder to join two or more components using a soldering means which melts the solder to join the two or more components.

The invention further provides an apparatus comprising one or more components, and a composite composition comprising a metal solder and inorganic oxide particles with a chemically bound organofunctional group on a surface of the particles dispersed in the solder, when the composition has been bonded to the components by heating.

The invention further provides a process of preparation of a solder preform composition comprising introducing inorganic oxide particles with a chemically bound organofunctional group on a surface of the particles to particles of a metal solder, mechanically mixing the particle and metal solder to form a paste, and melting the paste to form the preform wherein the particles are dispersed into the metal matrix.

The invention further provides a process of preparation of a shaped solder comprising introducing inorganic oxide particles with a chemically bound organofunctional group on a surface of the particles into a metal solder and a flux, mechanically mixing the particles and metal solder, melting the metal solder wherein the particles are dispersed into the metal solder and casting into a desired shape, cooling the shape, and cleaning the flux from the shape to provide the shaped solder.

The invention further provides embodiments of the previous solder methods, processes, and apparatuses, wherein the solder melts at less than about 250° C. In other embodiments of the previous solder methods, processes, and apparatuses, the solder is an alloy of metals. In some embodiments, the solder is lead-free. In some embodiments, the particles form a chemical bond with the solder. In some embodiments, the particle is a POSS-triol with the formula $R_7Si_7O_9(OH)_3$ and the structure:

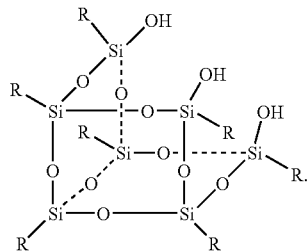

and R is the organo functional group. In some embodiments of the previous solder methods, processes, and apparatuses, the particles are cyclohexyl POSS-triol, while in others the particles are phenyl POSS-triol. In some embodiments of the of the previous solder methods, processes, and apparatuses, the metal is selected from the group consisting of tin (Sn), silver (Ag), copper (Cu), bismuth (Bi), zinc (Zn), indium (In), gold (Au), nickel (Ni), antimony (Sb), palladium (Pd), platinum (Pt), germanium (Ge), and mixtures thereof. In some embodiments, the metal matrix is Sn—Ag, and in further embodiments the metal matrix is a eutectic 96.5 wt % Sn-3.5 wt % Ag.

OBJECTS

Therefore, it is an object of the present invention to utilize the unique organofunctional inorganic oxides to achieve desired level of particulate size and dispersion in low melting metals as castings or solders, so as to enhance their service performance.

Another object of the present invention is to provide a lead-free solder with enhanced service performance.

These and other objects will become increasingly apparent by reference to the following description and the drawings.

BRIEF DESCRIPTION OF THE DRAWINGS

FIGS. 35A to 35H are SEM images of initial microstructure of various POSS containing composite solder joints.

FIGS. 41A and 41B are graphs showing schematic of shear deformation behavior 41A of eutectic Sn—Ag solder joints, and 41B POSS containing composite solder joints.

FIGS. 44A to 44D are SEM images of eutectic Sn—Ag solder joint after TMF with 0, 250, 500, and 1000 cycles.

FIGS. 45A to 45D are SEM images of 2 wt. % POSS containing solder joint after TMF with 0, 250, 500, and 1000 cycles.

FIGS. 46A to 46D are SEM images of 3 wt % POSS containing solder joint after TMF with 0, 250, 500, and 1000 cycles.

FIGS. 47A to 47C are SEM images of eutectic Sn—Ag based solder joints after 1000 TMF cycles.

DETAILED DESCRIPTION OF THE INVENTION

Figure 1:
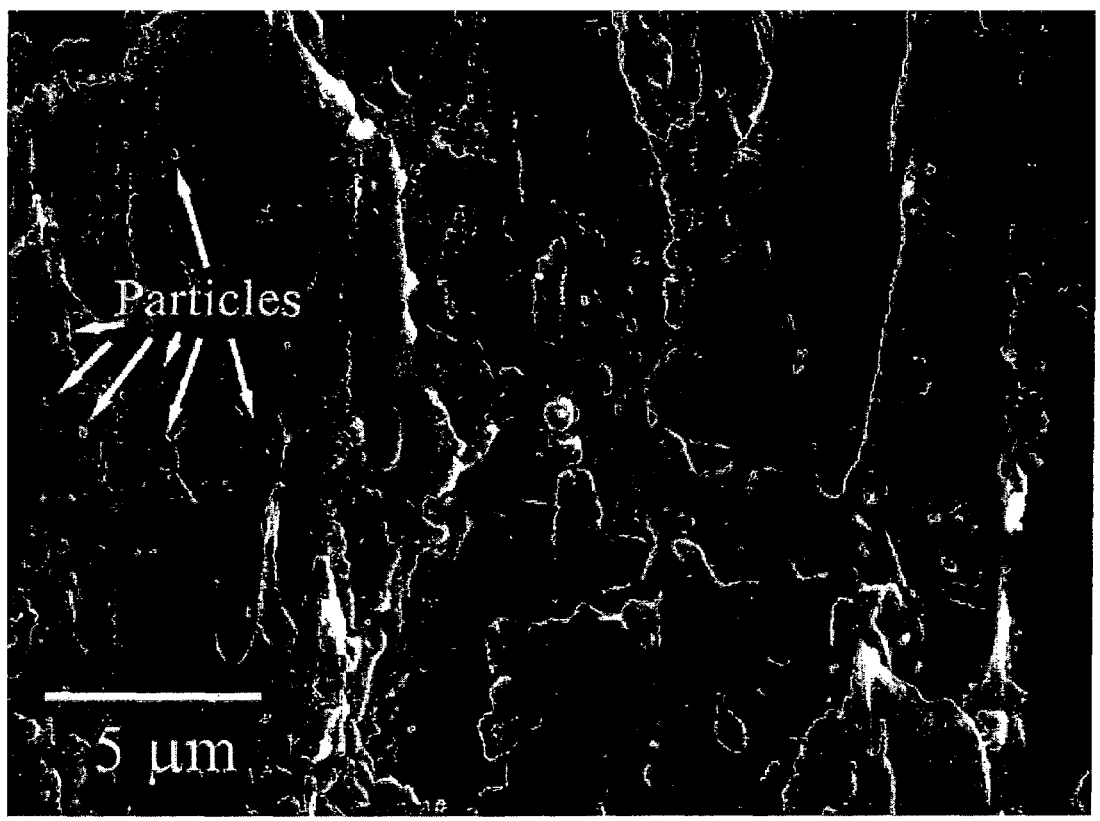
FIG. 1 illustrates a top view of a fracture surface of a solder joint with cyclohexyl POSS-triol. The bar represents five micrometers.

All patents, patent applications, government publications, government regulations, and literature references cited in this specification are hereby incorporated herein by reference in their entirety. In case of conflict, the present description, including definitions, will control. Definitions for the following terms are provided to promote a further understanding of the present invention.

"Organo-functional inorganic oxide particles" are particles preferably ranging from nanometer to sub-micron in size and are preferably caged. The inorganic oxide can be based upon a transition metal, lanthanide, or actinide metal atom, or a metalloid selected from the group consisting of boron, silicon, germanium, arsenic, and tellurium. Organo-functional inorganic oxide particles include, but are not limited to, a POSS, a POS, and organofunctional silicates as described in U.S. Pat. No. 6,284,696 to Koya, et al., and U.S. Pat. No. 6,465,387 to Pinnavaia et al. The particles have metal oxide cores, with an organic moiety covalently bound to the core which is resistant to decomposition. Each organic moiety is independently selected from the group consisting of aliphatic, and aromatic hydrocarbon groups. The organic moiety may include, but is not limited to, alkyl, cycloalkyl, alkenyl, cycloalkenyl, alkynyl, cycloalkynyl, aryl, and heteroaryl groups. The organic moiety may include, but are not limited by, hexyl, heptyl, octyl, cyclohexyl, vinyl, allyl, hexenyl, heptenyl, octenyl, and phenyl groups.

The term "POSS" refers to polyhedral oligomeric silsesquioxanes and derivatives thereof. POSS has the T-caged branch point structure:

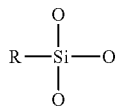

The general formula of POSS is $[R\,Si\,O_{1.5}]_n$, where R is an organic moiety which is the same or different at each occurrence, and is independently selected from the group consisting of aliphatic, and aromatic hydrocarbon groups. The organic moiety includes, but is not limited to, alkyl, cycloalkyl, alkenyl, cycloalkenyl, alkynyl, cycloalkynyl, aryl, and heteroaryl. One example of a POSS with n=6, and having a formula $R_6Si_6O_9$ is the structure:

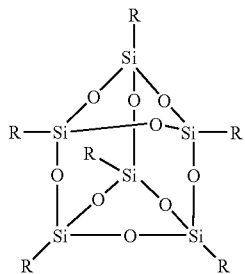

The term further includes, but is not limited to, triol derivatives thereof.

The term "POS" refers to polyhedral oligomeric silicates with the Q-cage structure and derivatives thereof, having the formula $[RMe_2SiOSiO_{1.5}]_n$. One example of a POS where n=6 is the structure:

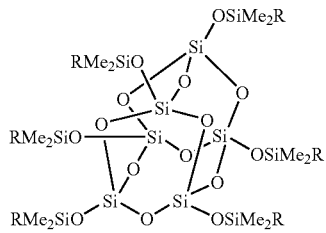

where R is an organic moiety which is the same or different at each occurrence and is independently selected from the group consisting of aliphatic, and aromatic hydrocarbon groups. The organic moiety includes, but is not limited to, alkyl, cycloalkyl, alkenyl, cycloalkenyl, alkynyl, cycloalkynyl, aryl, and heteroaryl. One example of a POS is The term further includes, but is not limited to, triol derivatives.

"Low-melting" is defined as having a melting point less than 600 degrees Celsius.

A "metal matrix" comprises a metal including, but not limited to, Magnesium (Mg), Zinc (Zn), Cadmium (Cd), Aluminum (Al), Indium (In), Thallium (Tl), Tin (Sn), Lead (Pb), Bismuth (Bi), and mixtures thereof. Furthermore it may be selected from the group consisting of tin (Sn), silver (Ag), copper (Cu), bismuth (Bi), zinc (Zn), indium (In), gold (Au), nickel (Ni), antimony (Sb), palladium (Pd), platinum (Pt), germanium (Ge), and mixtures thereof.

The term "lead-free" refers to a composition wherein the weight percentage of lead is less than 0.01 weight percent (0.01 wt. %).

A "composite solder" is a solder with intentionally incorporated reinforcements. The reinforcements of the present invention are organofunctional inorganic oxide particles. The particles are in the range of 0.1 to 10 weight percent of the matrix.

The invention preferably incorporates nanometer to sub-micron level, inert reinforcements which can bond with solder matrix. Preferably, the particle size is approximately ten to a hundred nanometers. Recent developments in POSS technology have opened up a new avenue for such applications. The POSS nano-technology can produce suitable means to promote bonding between such reinforcements and the metallic matrix. In addition, there are several means by which they can be incorporated within the solder so as to achieve nanometer to sub-micron size reinforcements. Such a composite approach does not alter the solderability of a given alloy system or its reflow properties. Electronic packaging, MEMS, and automotive/aerospace/defense electronics are some of the potential uses for the present invention. The related art lead-free solders do not include inorganic/organic nano-sized particle reinforcements.

Soldering using the present invention may be accomplished by partial heating or total heating methods. Partial heating methods include, but are not limited to, using a soldering iron, pulse heater, laser, light beam, hot air, and jet flow soldering. Total heating methods include, but are not limited to, infrared reflow, convection reflow, infrared convection combined, vapor phase soldering (VPS), and flow soldering.

The simplest localized method of using the composite solder is by means of a soldering iron by providing composite solder and heating the solder with the iron to melt it. The solder is then applied to the electronic component leads to make a connection. Another method of using the composite solder is to use pulse heat soldering. The composite solder is provided in advance and pressure is applied from a heater chip. Convection reflow is a method whereby the provided solder paste is heated by hot gas flowing from a nozzle. Laser soldering is accomplished by applying a laser beam to melt the provided solder. Light beam soldering is accomplished by applying light from a xenon lamp.

Generalized methods of soldering include reflow and flow (wave) soldering. Reflow entails melting and resolidifying the composite solder. The reflow method is performed by printing the composite solder paste upon a circuit board prior to mounting of the electronic component. Heat is applied to melt the solder onto leads of the component. Heat is applied using infrared panel heaters, convection heaters, or hot inert vapor atmospheres. Flow (wave) soldering is performed by mounting of the electronic component by adhesive or insertion into the board prior to flux application. This is then followed by forcing molten solder onto the electronic component. The present invention may be applied using either single-sided or double-sided soldering process flows.

The solder may be used in conjunction with various types of flux to increase solderability, such as R (rosin) type, RMA (mild-activated), and RA (activated) flux. The flux to be mixed with the solder may be either a non-water soluble flux or a water-soluble flux. A typical non-water soluble flux is the rosin-based flux, but other non-water soluble fluxes may be used. The rosin may be either polymerized or unpolymerized. The flux normally comprises a base material such as a rosin, a small amount of an activator, and optionally a thixotropic agent in a solvent. Examples of an activator for rosin include amine hydrohalide salts, amine organic acid salts, and organic acids. Examples of a thixotropic agent include hydrogenated castor oil. Solvents useful for non-water soluble fluxes include glycol ethers, lower alcohols, and terpene.

It is important to clean the solder after soldering to remove solder flux, oils, waxes, greases and other organic residues formed during bonding and assembly of electronic circuitry. Various cleaner formulations are available depending upon the type of flux used, and may be used to clean the composite solder composition following soldering. Water soluble fluxes can be easily removed with warm, soapy water. Rosin flux may be removed with chlorinated hydrocarbon solvents such as 1,1,1,-trichlorethane, trichloroethylene, trichloromonofluoromethane, methylene chloride, trichlorotrifluoroethane (CFC113), tetrachlorodifluoroethane (CFC112) and other solvents. U.S. Pat. No. 6,569,252 to Sachdev, et al., and U.S. Pat. No. 5,234,506 to Winston, et al. describe these cleaning compositions in further detail and are herein incorporated by reference.

Figure 17:
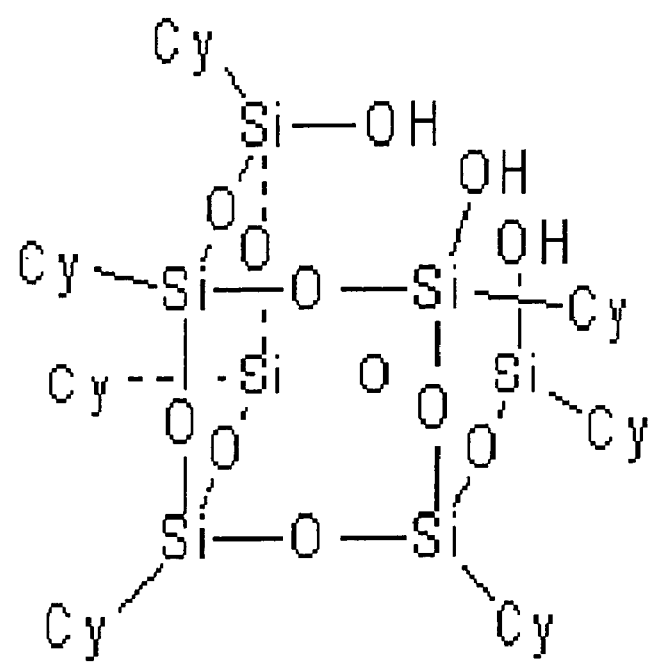
FIG. 17 illustrates the structure of cyclohexyl POSS-triol.
Figure 18:
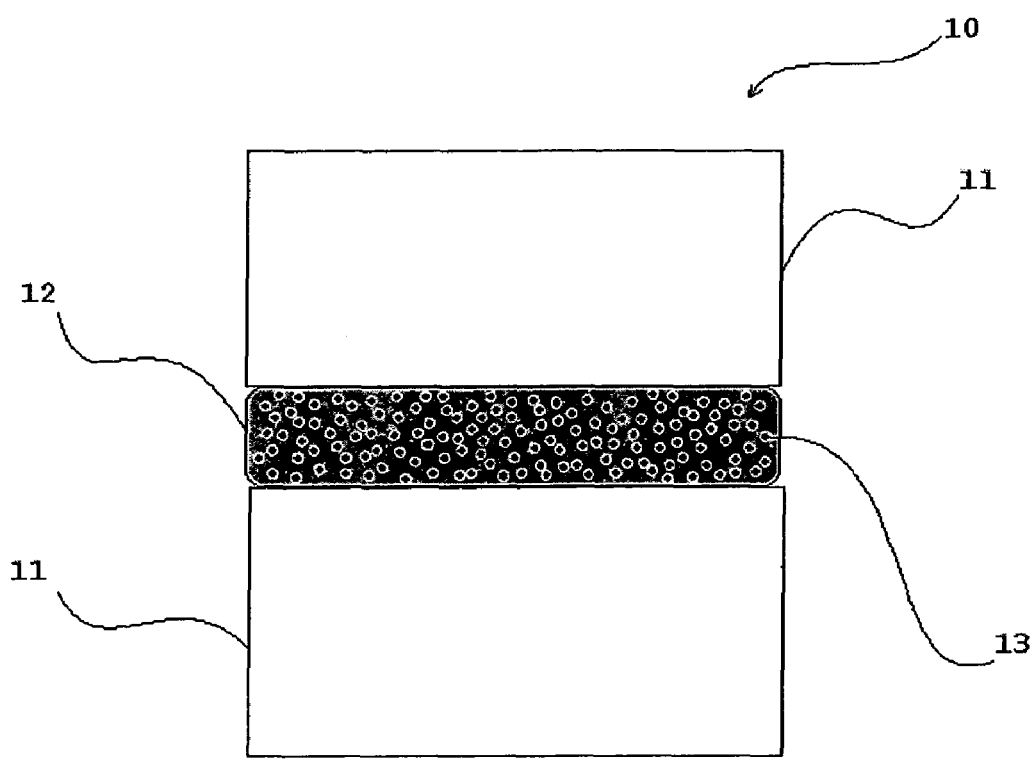
FIG. 18 illustrates a sketch of soldered components.
Figure 19:
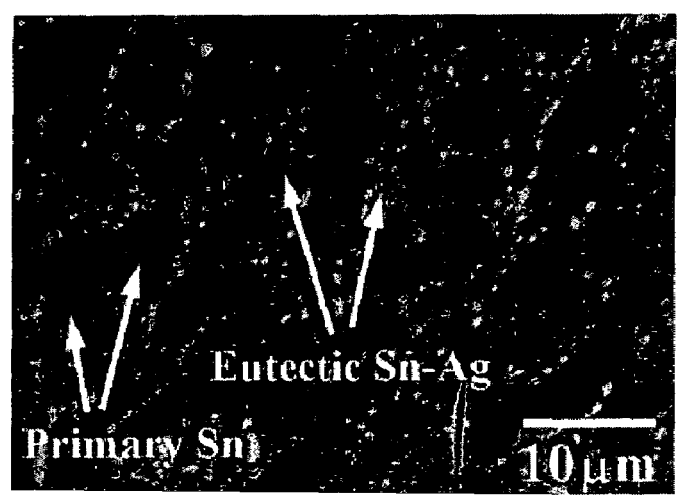
FIG. 19 illustrates microstructure of eutectic Sn—Ag. The bar represents ten micrometers.
Figure 33:
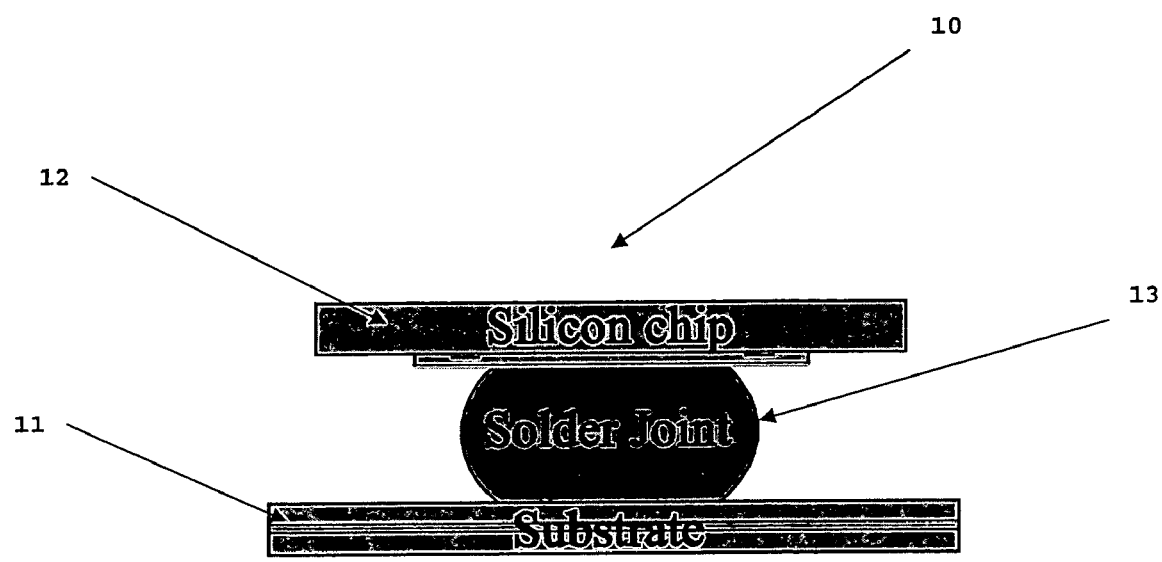
FIG. 33 illustrates a solder joint between a silicon chip and substrate.
Figure 34:
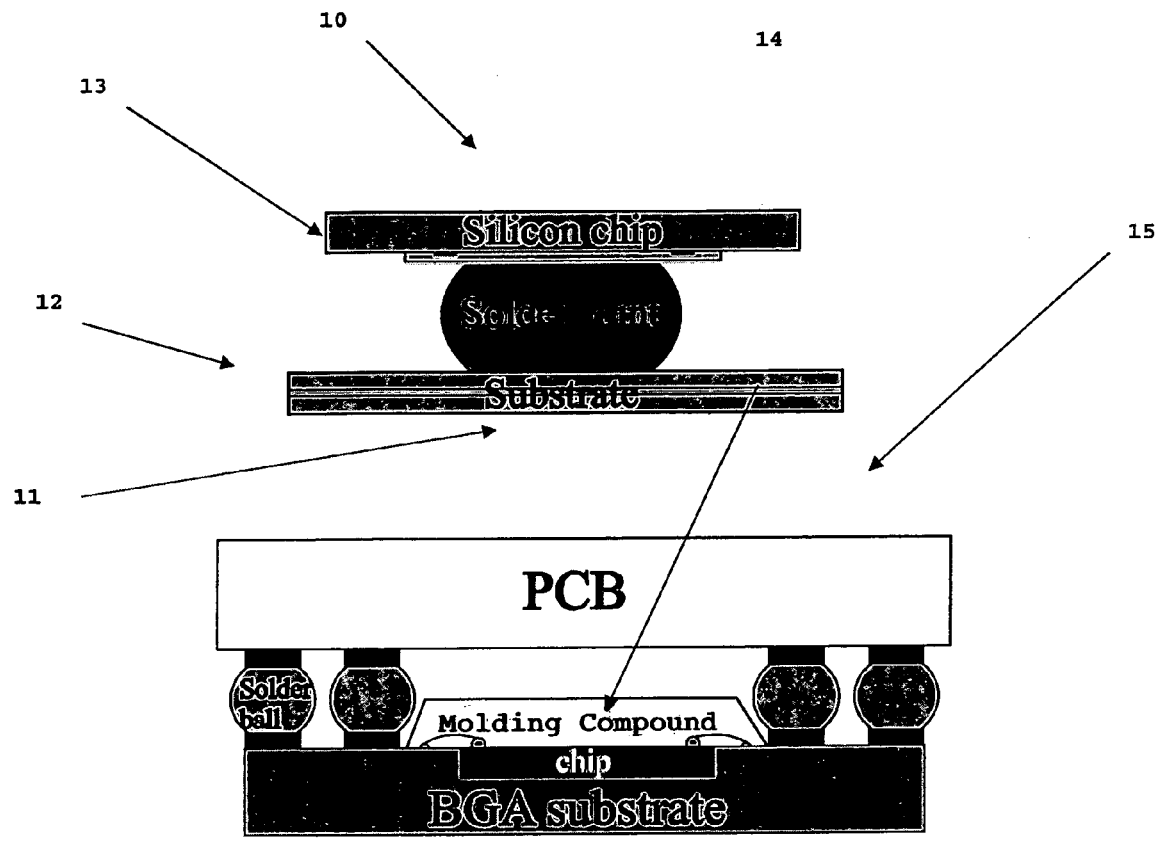
FIG. 34 illustrates a microchip connection with the composite solder.

Any of the aforementioned soldering techniques can be used to create circuitry using the composite solder. Soldered layers are shown in FIG. 17 connecting two leads 11, where particles 13 are dispersed within the solder matrix 12. FIG. 33 illustrates soldered layers 10 with a solder joint 13 between a silicon chip 12 and substrate 11. FIG. 34 illustrates a microchip connection 10 with the composite solder balls 12, connecting a printed circuit board (PCB) 13 with a chip 11 in Ball Grid Array (BGA) substrate 15, covered with molding compound 14. Circuits may be assembled using various electronic components including, but not limited to, integrated circuits, transistors, resistors, capacitors, diodes, rectifiers, microelectronic devices, and MEMS.

The synthesis of oligomeric silasesquioxanes is generally carried out by hydrolytic condensation of trifunctional $RSiY_3$ precursors, where R is a hydrocarbon radical and Y is a hydrolyzable group such as chloride, alkoxide or siloxide (J. Am. Chem. Soc. 1989, 111, 1741-1748; Organometallics 1991, 10, 2526-2528). This reaction usually produces mixtures of completely and incompletely condensed oligomeric silasesquioxanes. One important, completely condensed, oligomeric silasesquioxane is the compound $R_6Si_6O_9$. Compounds of this structure in which R is cyclohexyl can be reacted in the presence of basic catalysts with $RSi(OMe)_3$ to give functionalized, incompletely condensed silasesquioxanes of the structure:

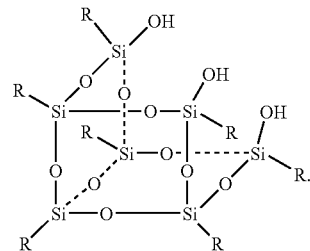

An example is $R_7Si_7O_9(OH)_3$ where R is cyclohexyl (Chem. Commun. 1999, 2153-2154, Polym. Mater. Sci. Eng. 2000, 82, 301-302).

Figure 32:
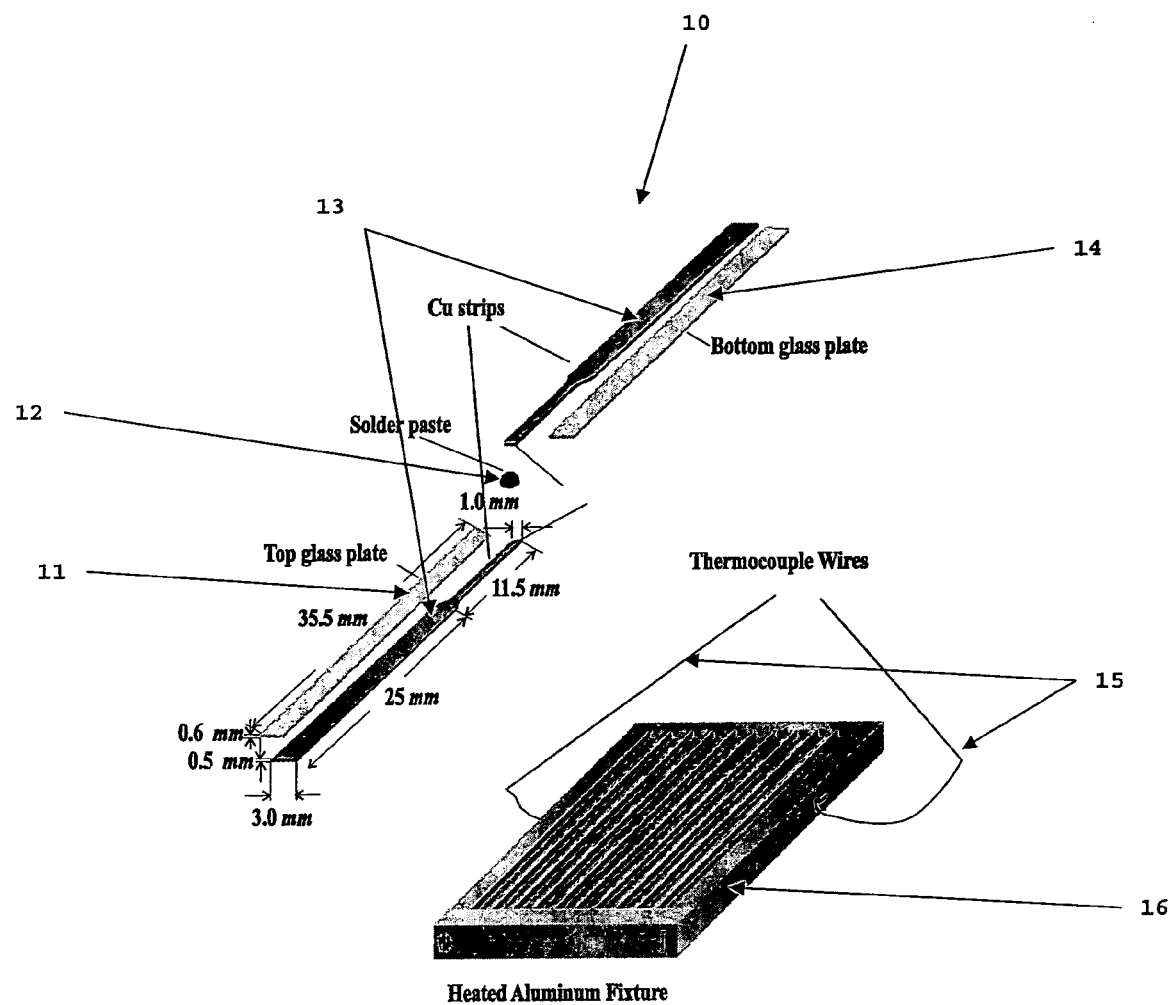
FIG. 32 illustrates the experimental set-up for solder joint fabrication. Copper strips, top glass plate, bottom glass plate, solder paste, thermocouple wires, heated aluminum fixture.

In the following examples, the composite solders were prepared by adding POSS to a solder matrix. Two different POSS with different active organic groups have been incorporated in eutectic 96.5 weight percent tin (Sn)-, 3.5 weight percent silver (Ag). FIG. 32 illustrates the experimental set-up 10 for solder joint fabrication. Single shear-lap solder joint specimens were prepared by joining half-dog-bone shaped copper strips 13. The solder joints, made from solder paste 12 between the copper strips 13, were about 100 μm thick and with about 1 mm×1 mm solder joint area. These joints were made with an aluminum fixture 16 upon which the assembly of copper strips 13, with top glass plate 11 and bottom glass 14, were placed. The aluminum fixture 16 was placed on a hot plate. Once the temperature, measured via thermocouple wires 15, of the region to be joined reached about 30-50° C. above the melting point of the solder, the aluminum fixture 16 was be removed from the hot plate and placed on an aluminum block to cool. One of the joint surfaces was metallurgically polished to observe the microstructural features after various treatments and tested with a Scanning Electron Microscope (SEM). POSS size and distribution was being examined from the side surface and from the fracture surfaces of the mechanically tested samples.

Mechanical testing of single shear-lap solder joints made with nanocomposite solders exhibited fine well-distributed POSS reinforcements and tested with a very sensitive thermomechanical analyzer. The main purpose of these tests was to identify the POSS reinforcements which enhance the shear strength. Shear ductility is a parameter that should be reduced for dimensional stability. It should be increased to make the solder joint compliant to accommodate the imposed strains, especially under impact conditions. The fracture surfaces of these shear tested specimens were used to identify the size and distribution of the POSS particulates. The polished side surface of the solder joints were examined with SEM for identifying the deformation features and their implications.

The reinforcements were strongly bonded to the metallic matrix. They did not agglomerate. Well distributed, one hundred nanometer size reinforcements were noted. No compound formation at the interface also indicates that true inert nature of these POSS molecules. They enhance the strength to some extent.

EXAMPLE 1

Solder joints were constructed comprising a cyclohexyl POSS-triol incorporated in eutectic 96.5 weight percent tin (Sn)-3.5 weight percent silver (Ag) supplied by Multicore Solder Inc., Product number NC63. (Multicore solder is now a part of Henkel). Cyclohexyl POSS-triol has the chemical formula $(C_6H_{11})_7Si_7O_9(OH)_3$ and the structure:

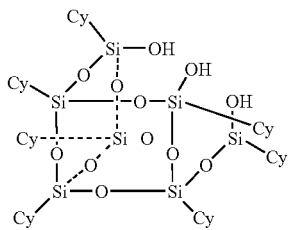

where Cy represents the cyclohexyl moiety.

Figure 2:
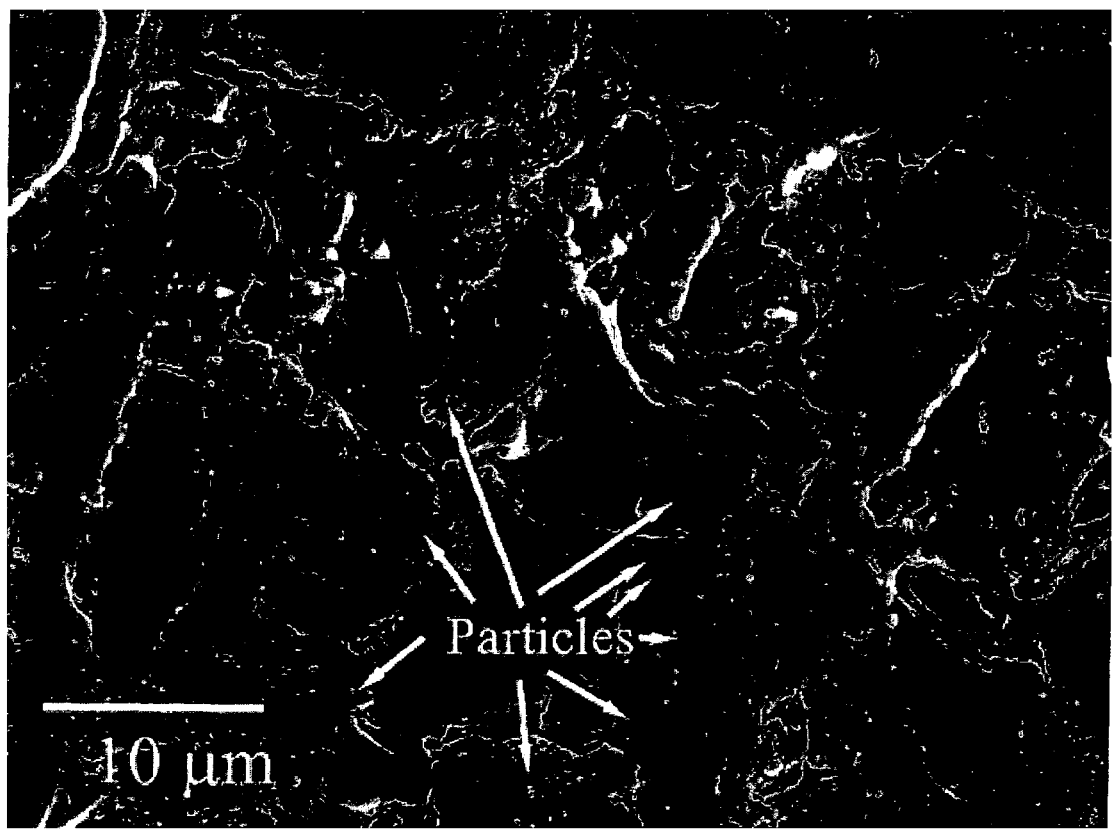
FIG. 2 illustrates a top view of a fracture surface of a solder joint with cyclohexyl POSS-triol. The bar represents ten micrometers.
Figure 3:
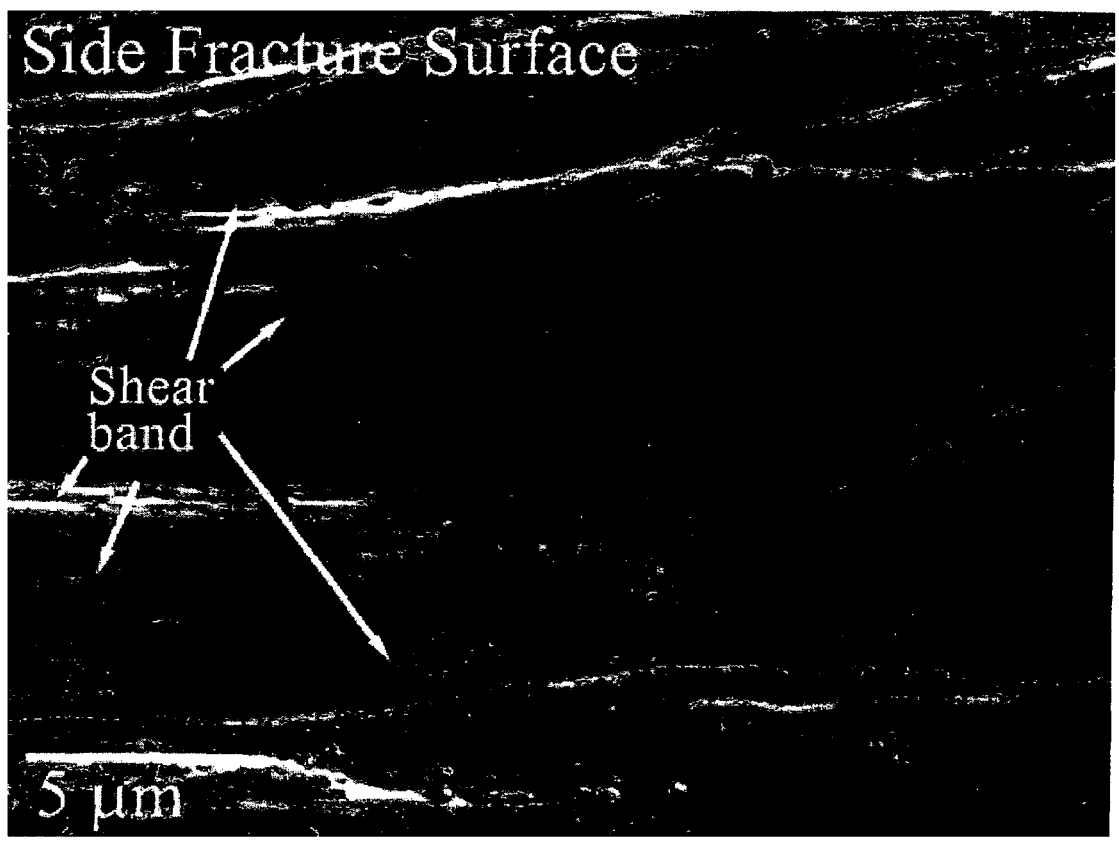
FIG. 3 illustrates a side fracture surface of a solder joint with cyclohexyl POSS-triol. The bar represents five micrometers.
Figure 4:
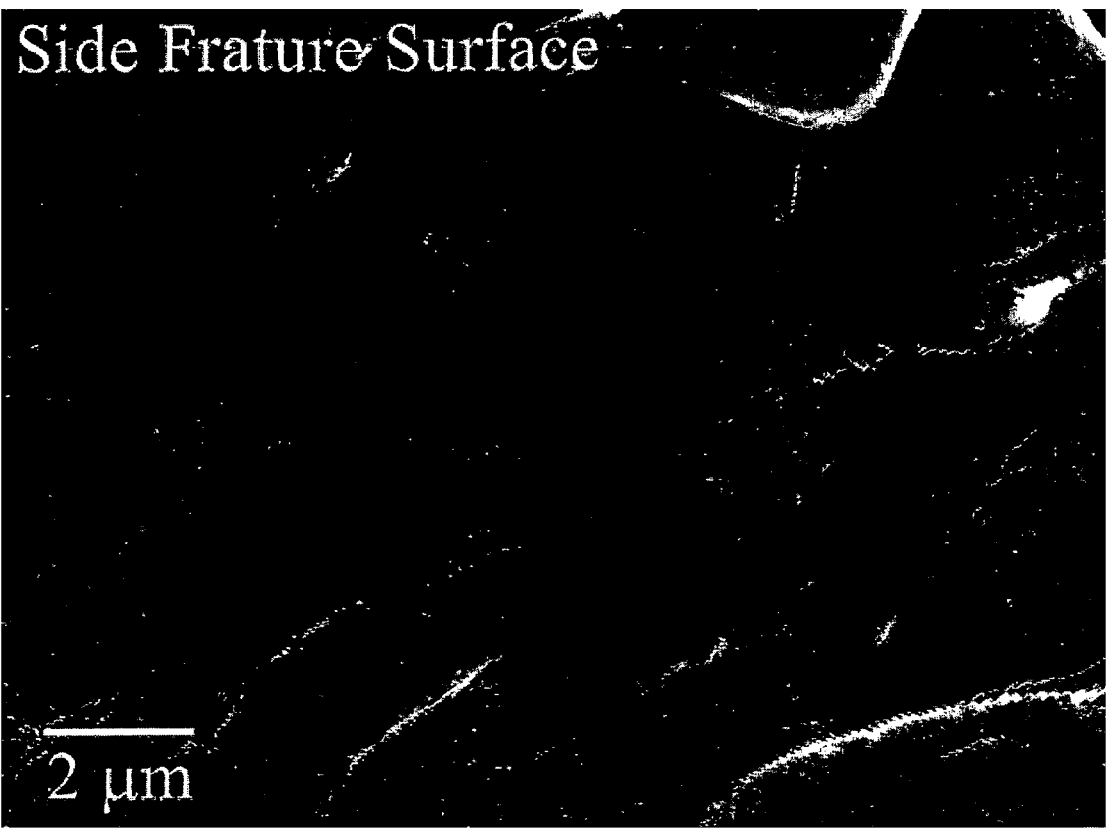
FIG. 4 illustrates a side fracture surface of a solder joint with cyclohexyl POSS-triol. The bar represents two micrometers.
Figure 5:
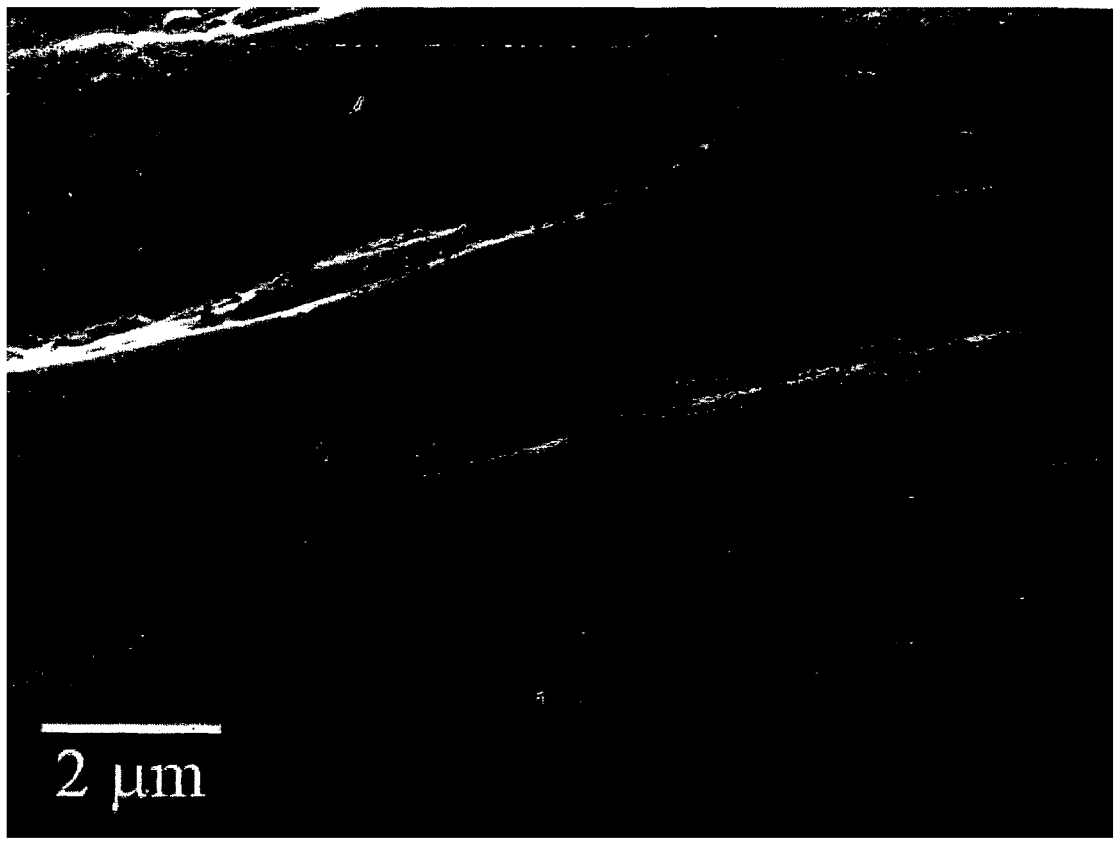
FIG. 5 illustrates a side fracture surface of a solder joint with cyclohexyl POSS-triol. The bar represents two micrometers.
Figure 6:
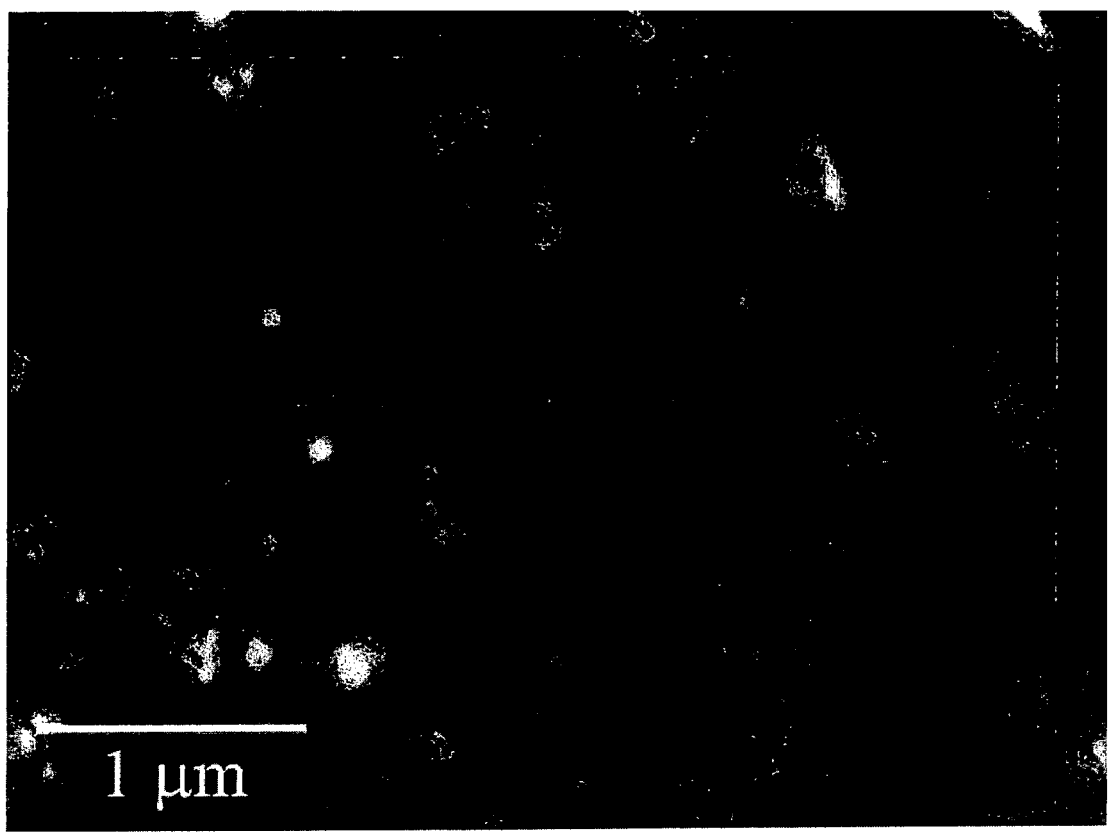
FIG. 6 illustrates a high magnification view of polished surface of a solder joint with cyclohexyl POSS-triol. The bar represents one micrometer.
Figure 7:
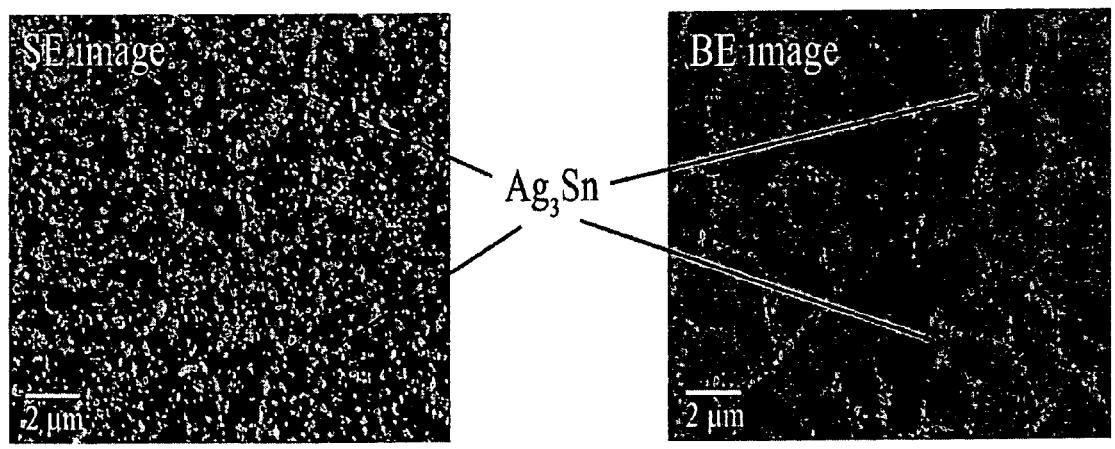
FIG. 7 illustrates an SE image of polished surface of a solder joint with cyclohexyl POSS-triol. The SE image and BE image is at same area showing clear $Ag_3Sn$ particles. The bars represent two micrometers.
Figure 8:
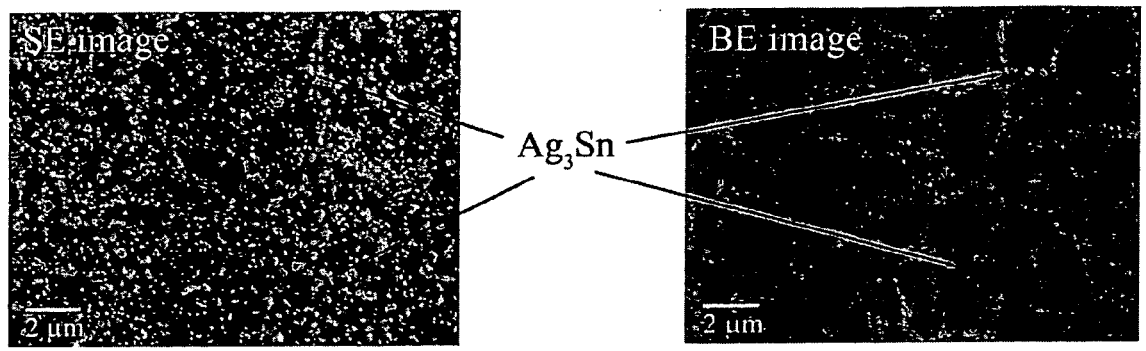
FIG. 8 illustrates a BE image of polished surface of a solder joint with cyclohexyl POSS-triol. The SE image and BE image is at same area showing clear Ag$_3$Sn particles. The bars represent two micrometers.
Figure 20:
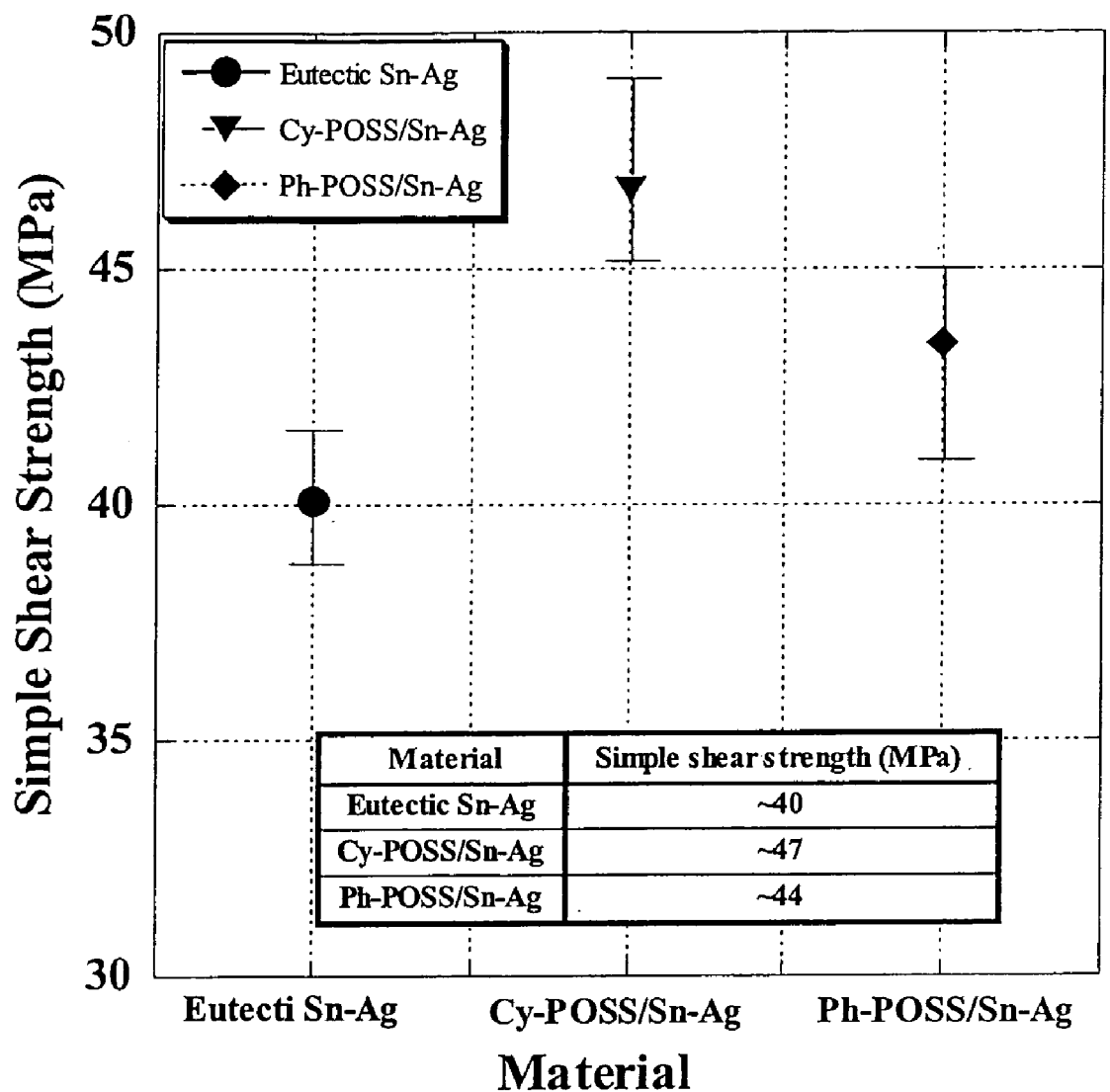
FIG. 20 illustrates the shear strength of eutectic Sn—Ag and composites.

The solder joints were fractured and the surfaces were analyzed using scanning electron microscopy. The top view of a fracture surface of solder joints with cyclohexyl POSS-triol at five and ten micron scale are shown in FIGS. 1 and 2, respectively. Particles are noted. A side fracture surface of solder joints with cyclohexyl POSS-triol at five microns is shown in FIG. 3, while two micron magnifications of the surface are shown in FIG. 4 and FIG. 5. Shear bands are noted in FIG. 3. A polished surface of solder joints with cyclohexyl POSS-triol at the one micron scale are shown in FIG. 6. FIGS. 7 and 8 show both scanning electron (SE) and back scattered electron (BE) images of the same area of polished surface of solder joints with cyclohexyl POSS-triol. Clear particles of $Ag_3Sn$ are noted. FIG. 20 illustrates the simple shear strength of eutectic Sn—Ag and the cyclohexyl POSS-triol composite.

EXAMPLE 2

Solder joints were constructed comprising a phenyl POSS-triol incorporated in eutectic 96.5 weight percent tin (Sn)-3.5 weight percent silver (Ag) supplied by Multicore Solder Inc., Product number NC63. (Multicore solder is now a part of Henkel). Phenyl POSS-triol has the chemical formula $(C_6H_5)_7 Si_7O_9(OH)_3$ and the structure:

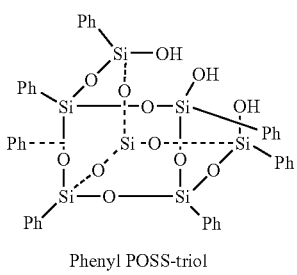

Phenyl POSS-triol where Ph represents the phenyl moiety.

Figure 9:
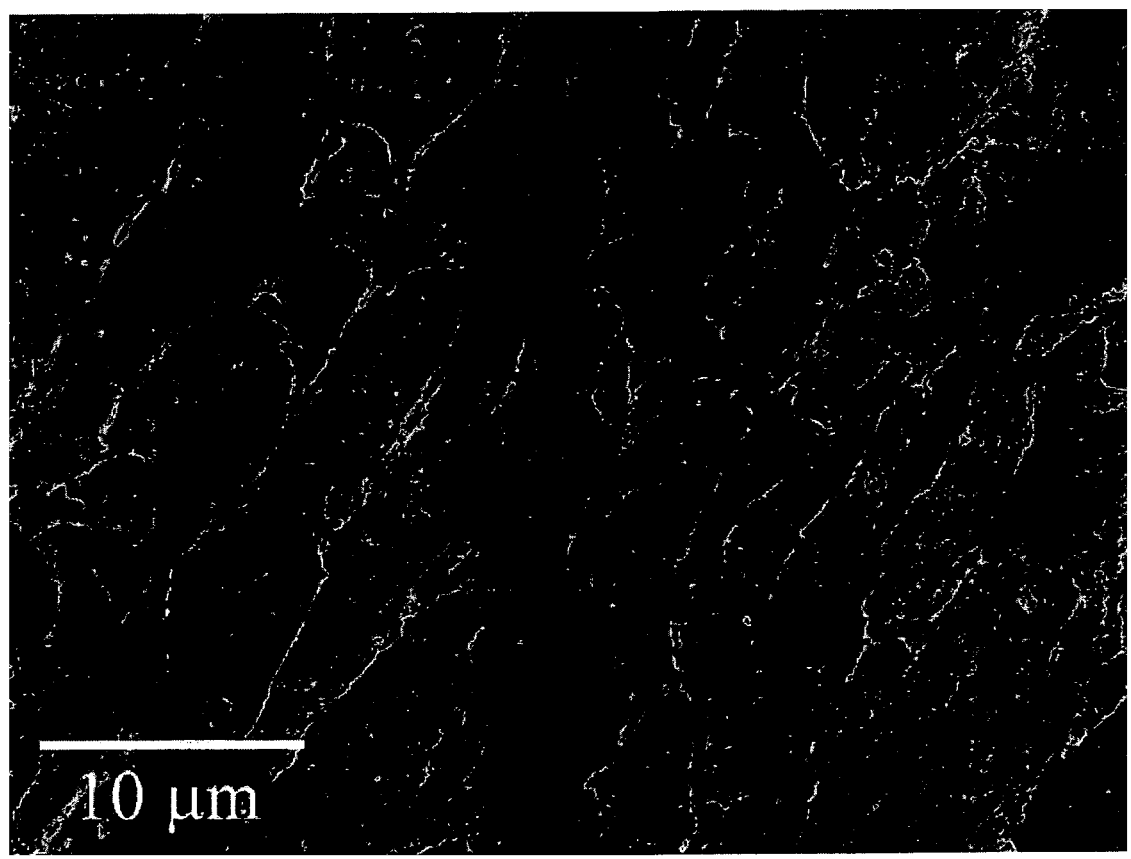
FIG. 9 illustrates a top view of a fracture surface of a solder joint with phenyl POSS-triol. The bar represents ten micrometers.
Figure 10:
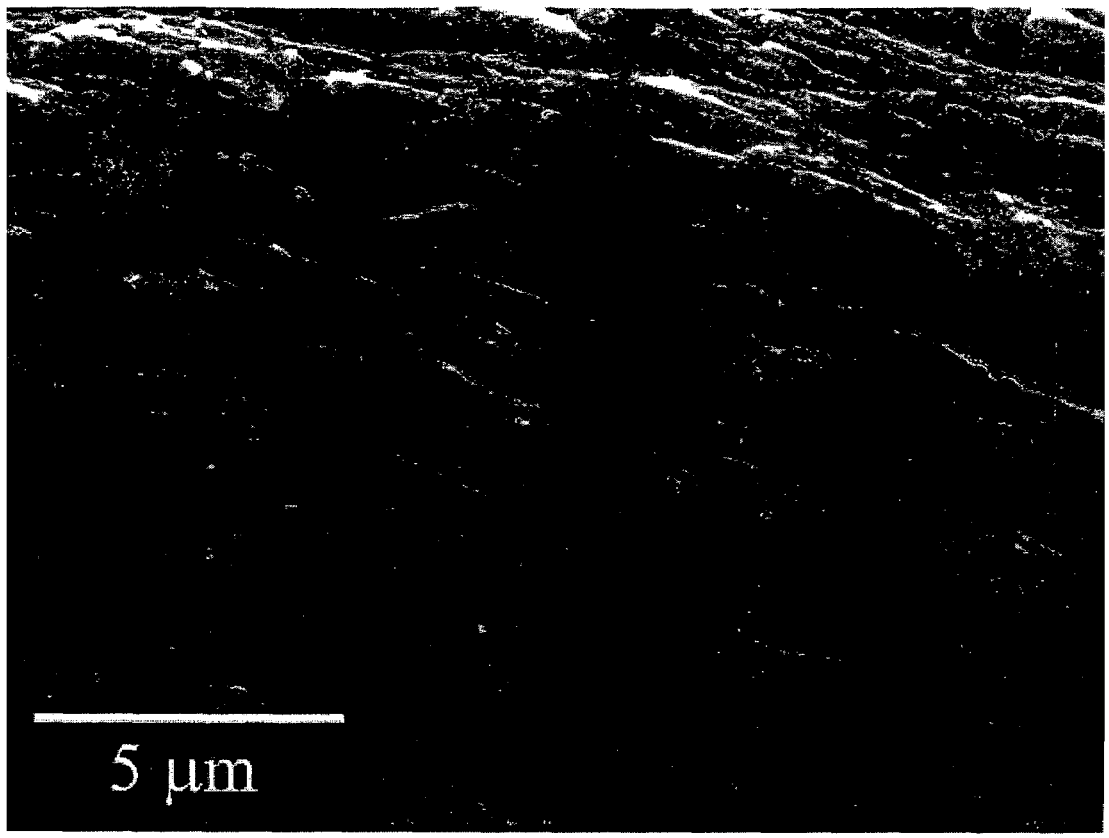
FIG. 10 illustrates a side view of a fracture surface of a solder joint with phenyl POSS-triol. The bar represents five micrometers.
Figure 11:
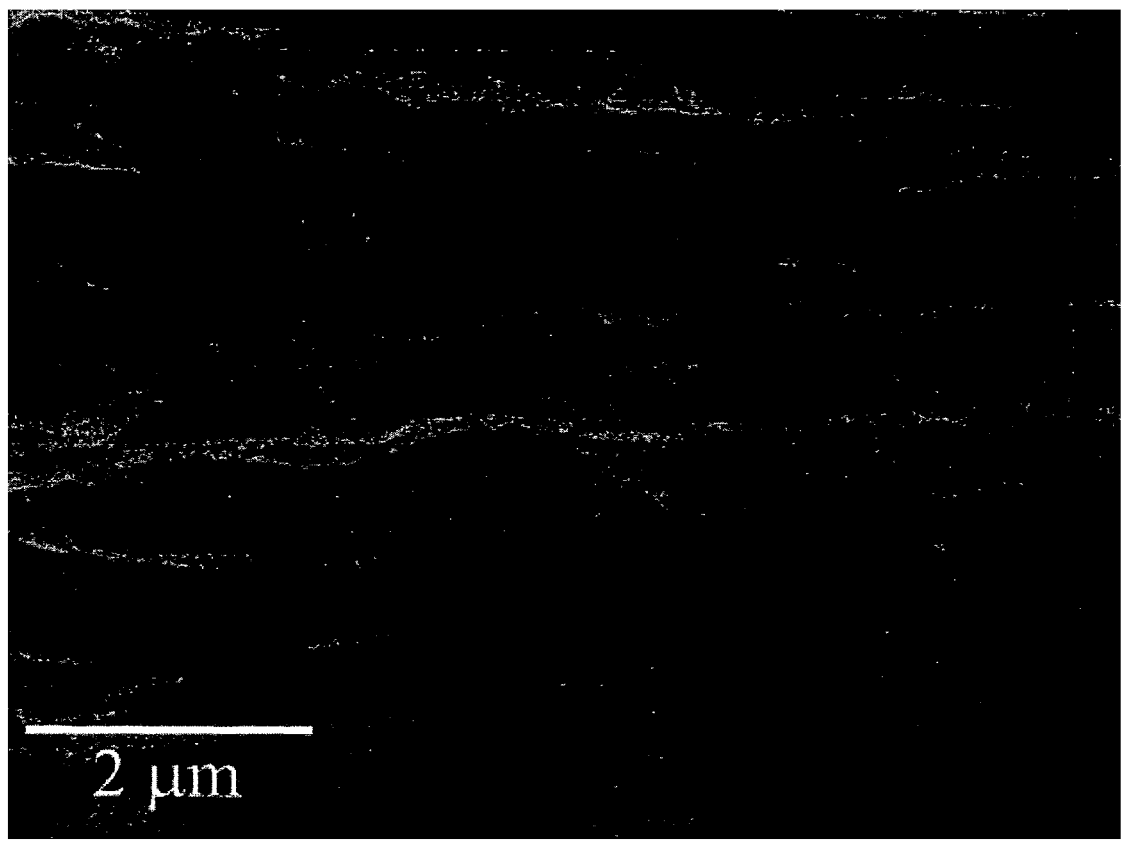
FIG. 11 illustrates a side fracture surface of a solder joint with phenyl POSS-triol. The bar represents two micrometers.
Figure 12:
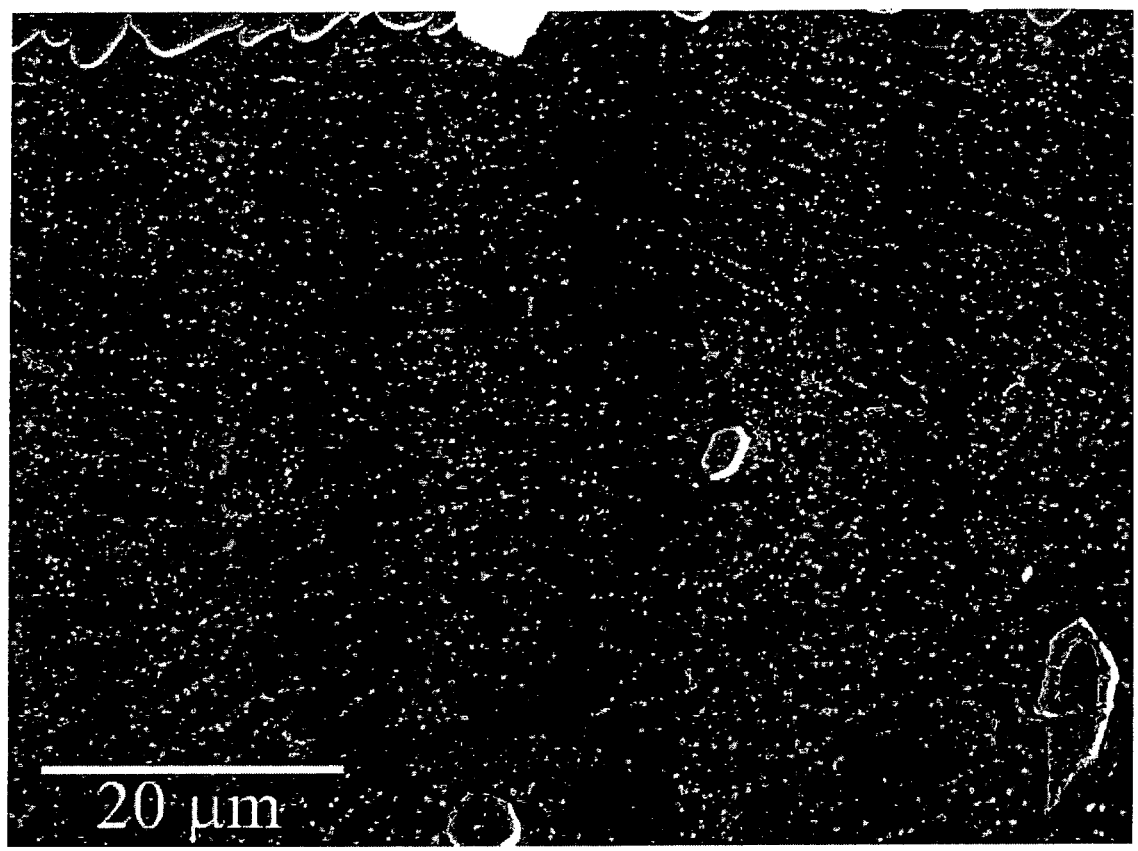
FIG. 12 illustrates a polished surface of a solder joint with phenyl POSS-triol. The bar represents twenty micrometers.
Figure 13:
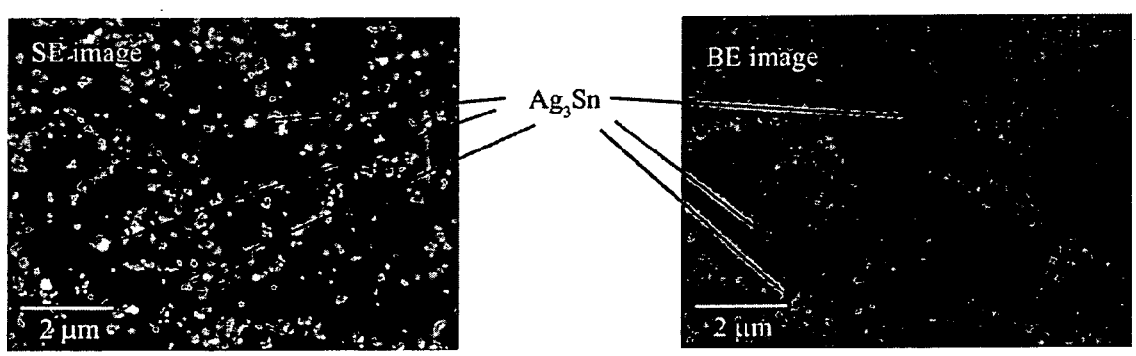
FIG. 13 illustrates an SE image of polished surface of a solder joint with phenyl POSS-triol showing clear Ag$_3$Sn particles. The bar represents two micrometers.
Figure 14:
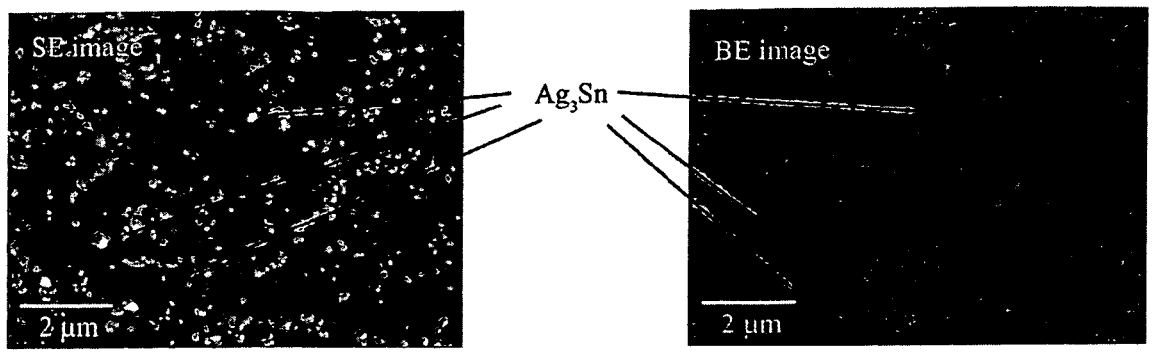
FIG. 14 illustrates a BE image of polished surface of a solder joint with phenyl POSS-triol showing clear Ag$_3$Sn particles. The bars represent two micrometers.
Figure 15:
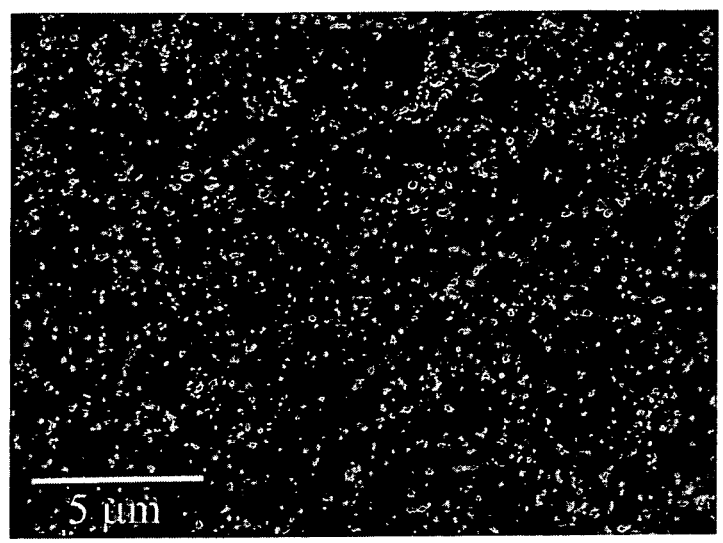
FIG. 15 illustrates a polished surface of a solder joint with phenyl POSS-triol. The bar represents five micrometers.
Figure 16:
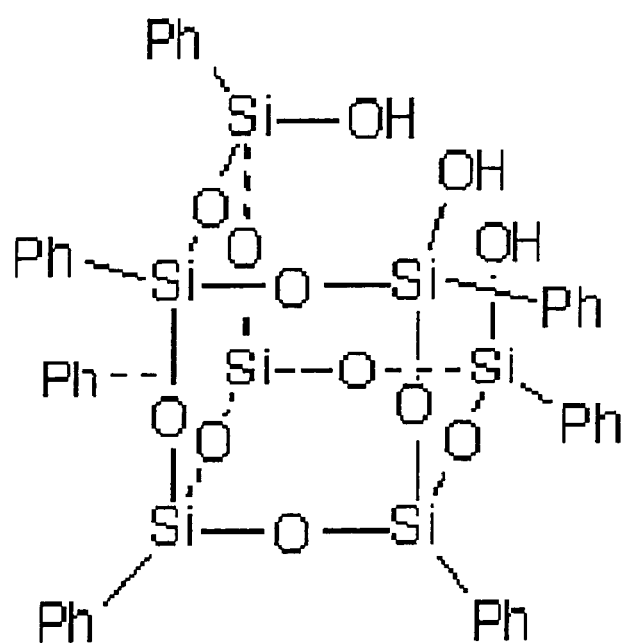
FIG. 16 illustrates the structure of phenyl POSS-triol.

The solder joints were fractured and the surfaces were analyzed using scanning electron microscopy. FIG. 9 shows a top view of a fracture surface of a solder joint with phenyl POSS-triol at the ten micron scale. A side view of a fracture surface of a solder joint with phenyl POSS-triol at five micron scale is shown in FIG. 10, while FIG. 11 shows a side fracture surface of a solder joint with phenyl POSS-triol at the two micron scale. FIG. 12 shows a polished surface of a solder joint with phenyl POSS-triol at twenty micron scale. FIG. 13 and FIG. 14 show both SE and BE images of polished surface of a solder joint with phenyl POSS-triol. Clear particles of $Ag_3Sn$ are noted. FIG. 20 illustrates the simple shear strength of eutectic Sn—Ag and the phenyl POSS-triol composite.

EXAMPLE 3

The experiments were repeated using eutectic Sn—Ag from another solder supplier. (Kester; product number R520A). Composite solders were prepared using Kester eutectic Sn-3.5 Ag solder, product number R520A. 0.2765 grams of POSS-Cyclohexyltriol was added to 5.1674 grams of solder, thereby creating 5.07 weight percent particles mixed in eutectic Sn-3.5 Ag. (see Table 1). The approximate volume percent of the particulates mixed in eutectic Sn-3.5 Ag is 20 volume percent.

TABLE 1

Composite solder mechanically fabricated with eutectic Sn-3.5Ag (Kester, Product R520A).

| | Weight used in composite solder. | |
|---|---|---|
| | Solder (Kester) | POSS |
| POSS Phenyltriol | 5.0639 gram | 0.2745 gram |
| POSS cyclohexyl triol | 5.1674 gram | 0.2765 gram |
| wt % of particulates mixed in eutectic Sn-3.5Ag | | |
| 1. POSS-Phenyltriol (Tr-POSS): | | 5.14% |
| 2. POSS-Cyclohexyltriol (Cy-POSS): | | 5.07% |
| vol % of particulates mixed in eutectic Sn-3.5Ag | | |
| Approximately 20 vol % of particulates for each composite solders | | |

Figure 21:
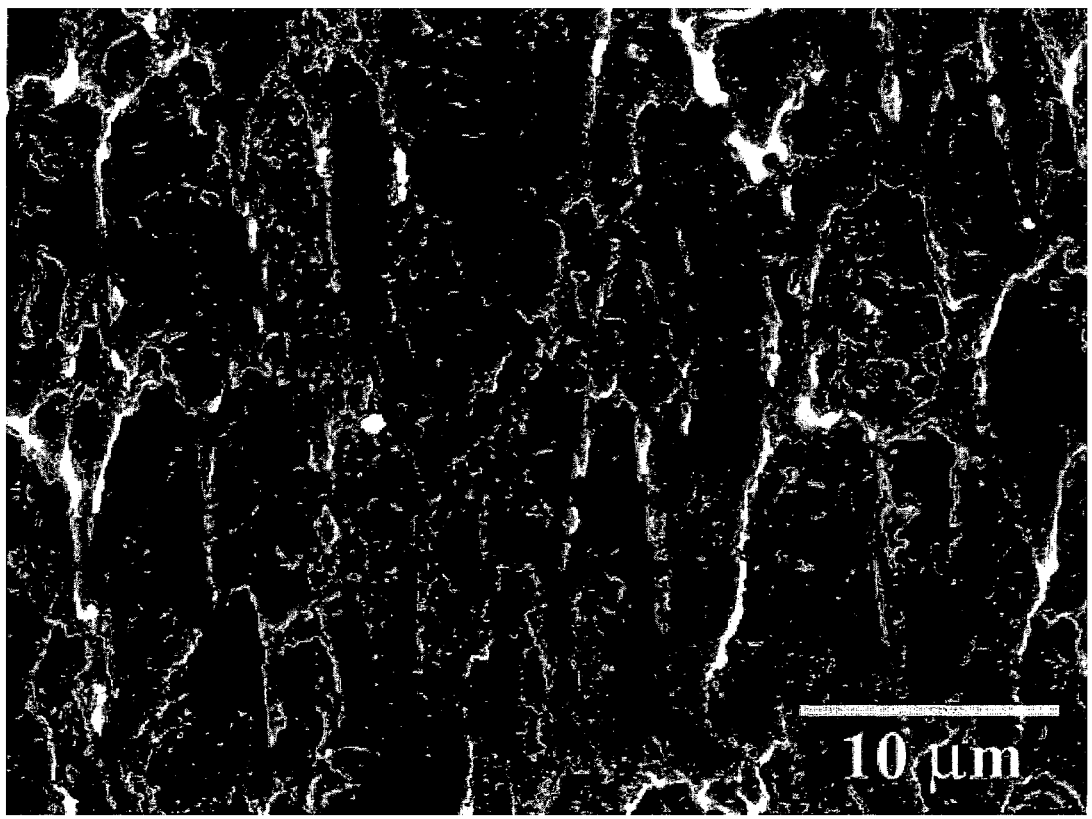
FIG. 21 illustrates a fracture surface of a cyclohexyl POSS-triol/Sn—Ag solder joint at low magnification. The bar represents ten micrometers.
Figure 22:
FIG. 22 illustrates a fracture surface of a cyclohexyl POSS-triol/Sn—Ag solder joint at high magnification. The bar represents two micrometers.
Figure 23:
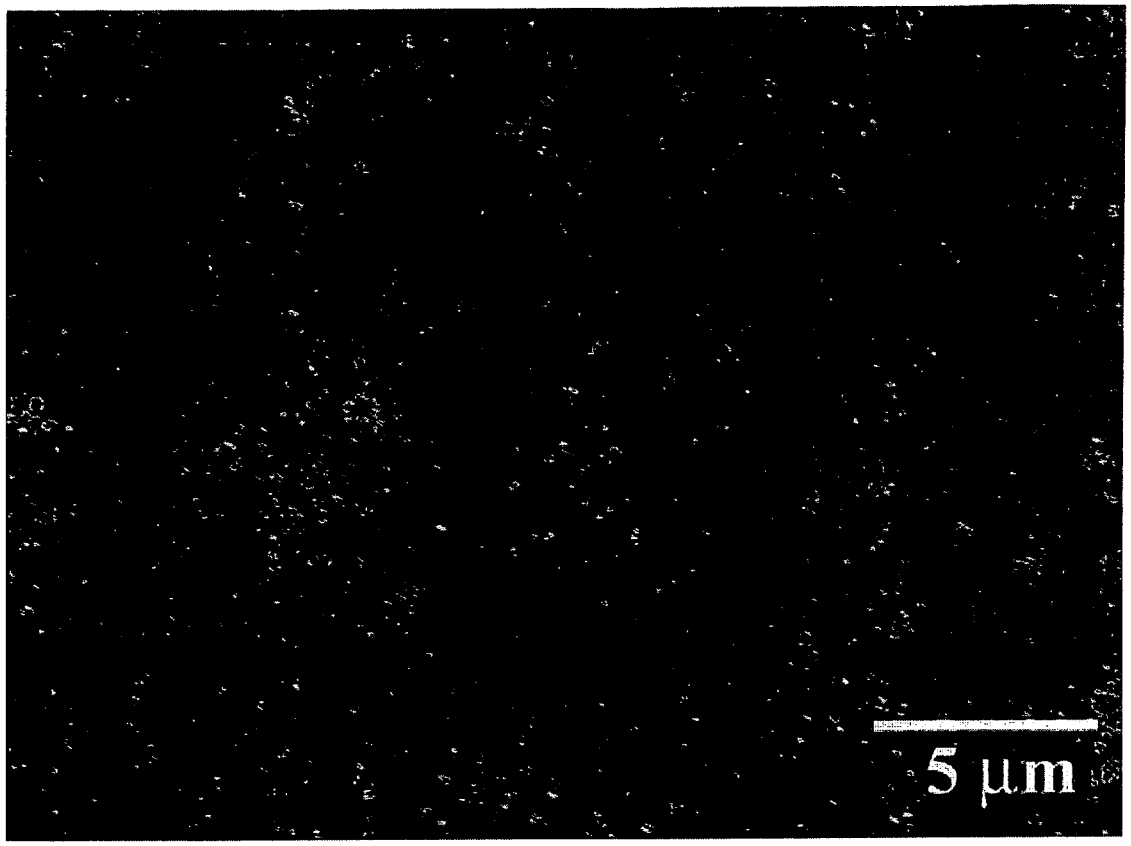
FIG. 23 illustrates an SE image of a polished surface of a cyclohexyl POSS-triol/Sn—Ag solder joint. The bar represents five micrometers.
Figure 24:
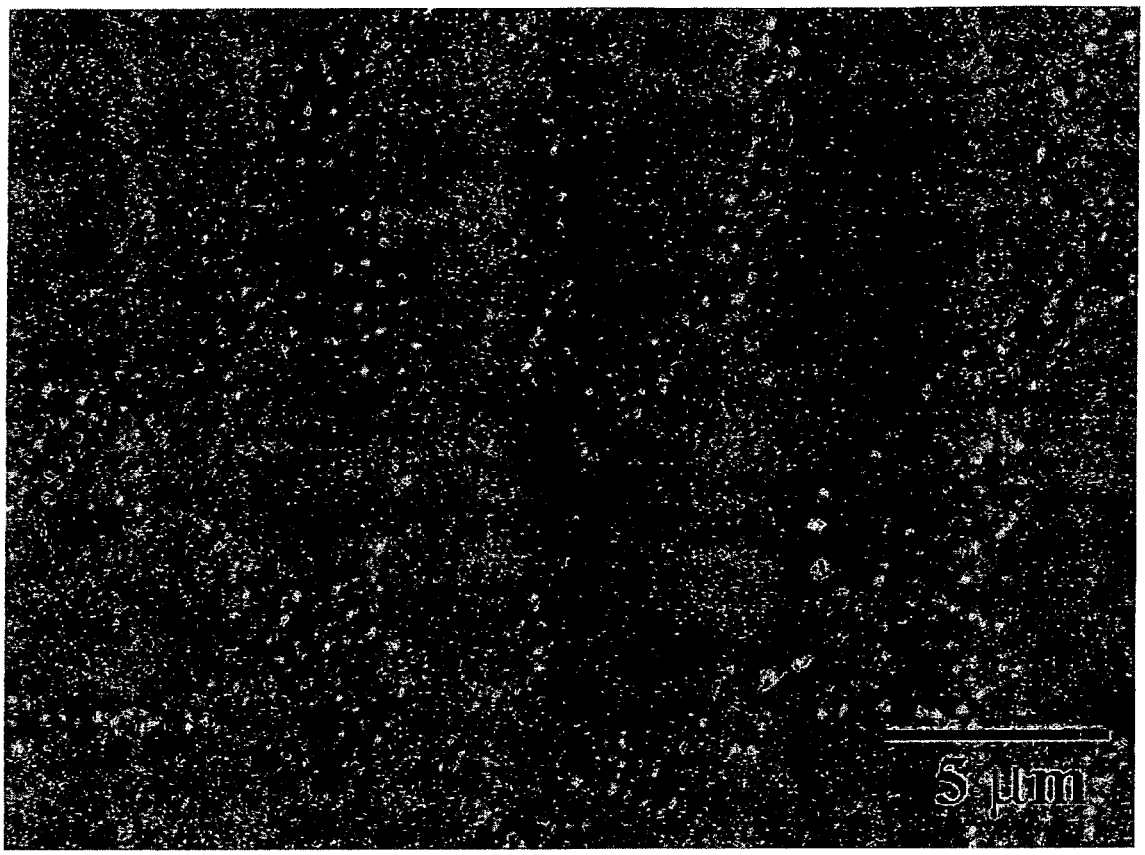
FIG. 24 illustrates a BE image of a polished surface of a cyclohexyl POSS-triol/Sn—Ag solder joint. The bar represents five micrometers.
Figure 25:
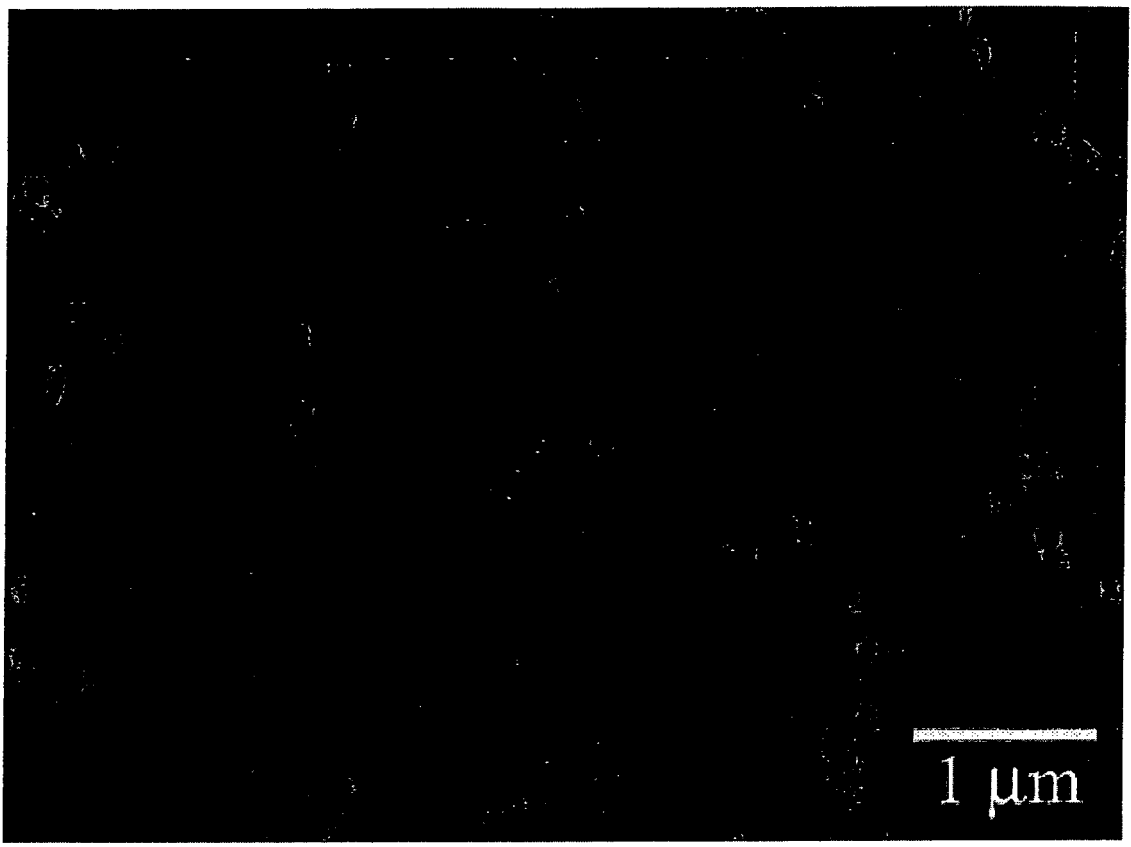
FIG. 25 illustrates a polished surface of a cyclohexyl POSS-triol/Sn—Ag solder joint at high magnification. The bar represents one micrometer.
Figure 31:
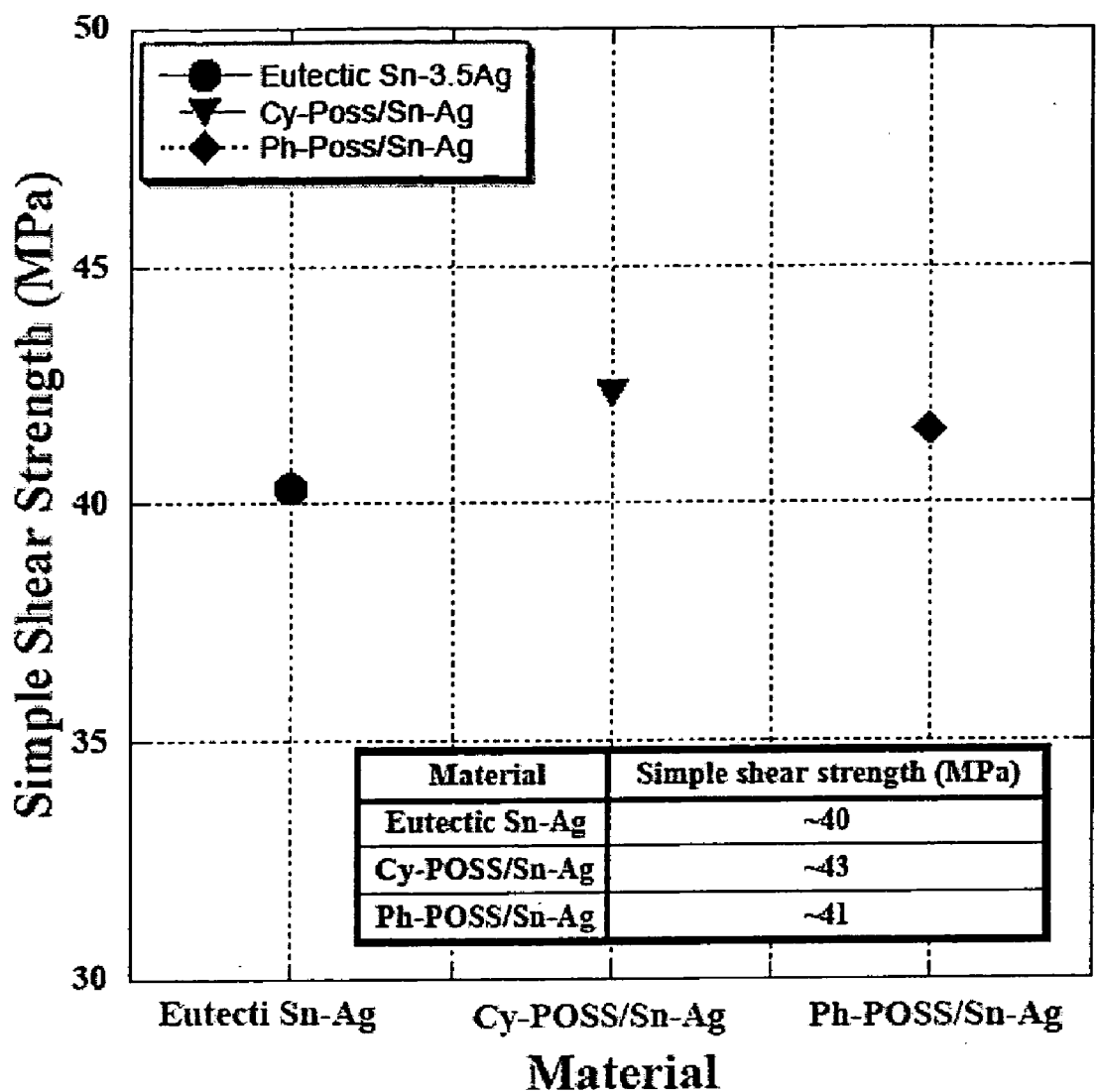
FIG. 31 illustrates the simple shear strength of eutectic Sn—Ag and composites.

FIG. 21 illustrates a fracture surface of cyclohexyl POSS-triol/Sn—Ag solder joints at low magnification. The bar represents ten micrometers. FIG. 22 illustrates a fracture surface of cyclohexyl POSS-triol/Sn—Ag solder joints at high magnification. The bar represents two micrometers. FIG. 23 illustrates an SE image of a polished surface of cyclohexyl POSS-triol/Sn—Ag solder joints. The bar represents five micrometers. FIG. 24 illustrates a BE image of a polished surface of cyclohexyl POSS-triol/Sn—Ag solder joints. The bar represents five micrometers. FIG. 25 illustrates a polished surface of cyclohexyl POSS-triol/Sn—Ag solder joints at high magnification. The bar represents one micrometer. FIG. 31 illustrates the simple shear strength of eutectic Sn—Ag and the cyclohexyl POSS-triol composite.

EXAMPLE 4

A POSS-Phenyltriol composite solder was prepared using Kester eutectic Sn-3.5 Ag solder, product number R520A. 0.2745 grams of POSS-Phenyltriol was added to 5.0639 grams of solder, thereby creating 5.14 weight percent particles mixed in eutectic Sn-3.5 Ag. (see Table 1). The approximate volume percent of the particulates mixed in eutectic Sn-3.5 Ag is 20 volume percent.

Figure 26:
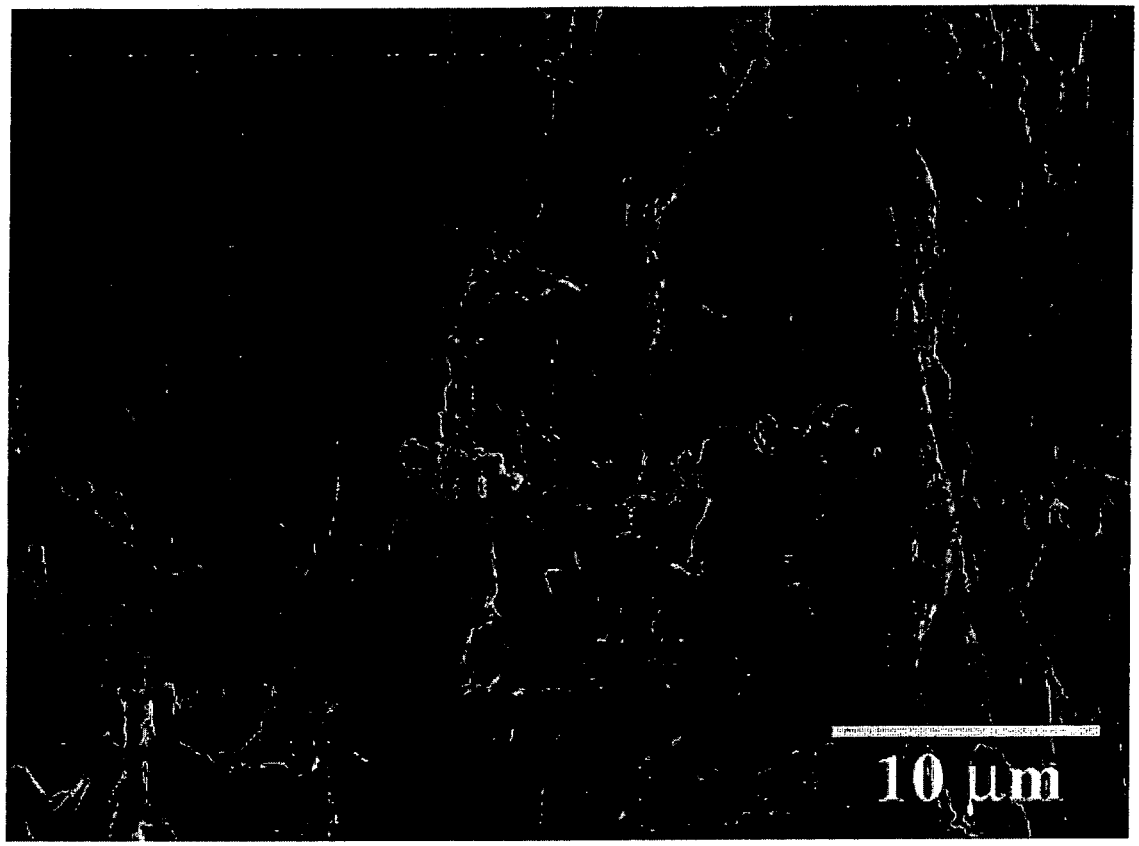
FIG. 26 illustrates a fracture surface of a phenyl POSS-triol/Sn—Ag solder joint at low magnification. The bar represents ten micrometers.
Figure 27:
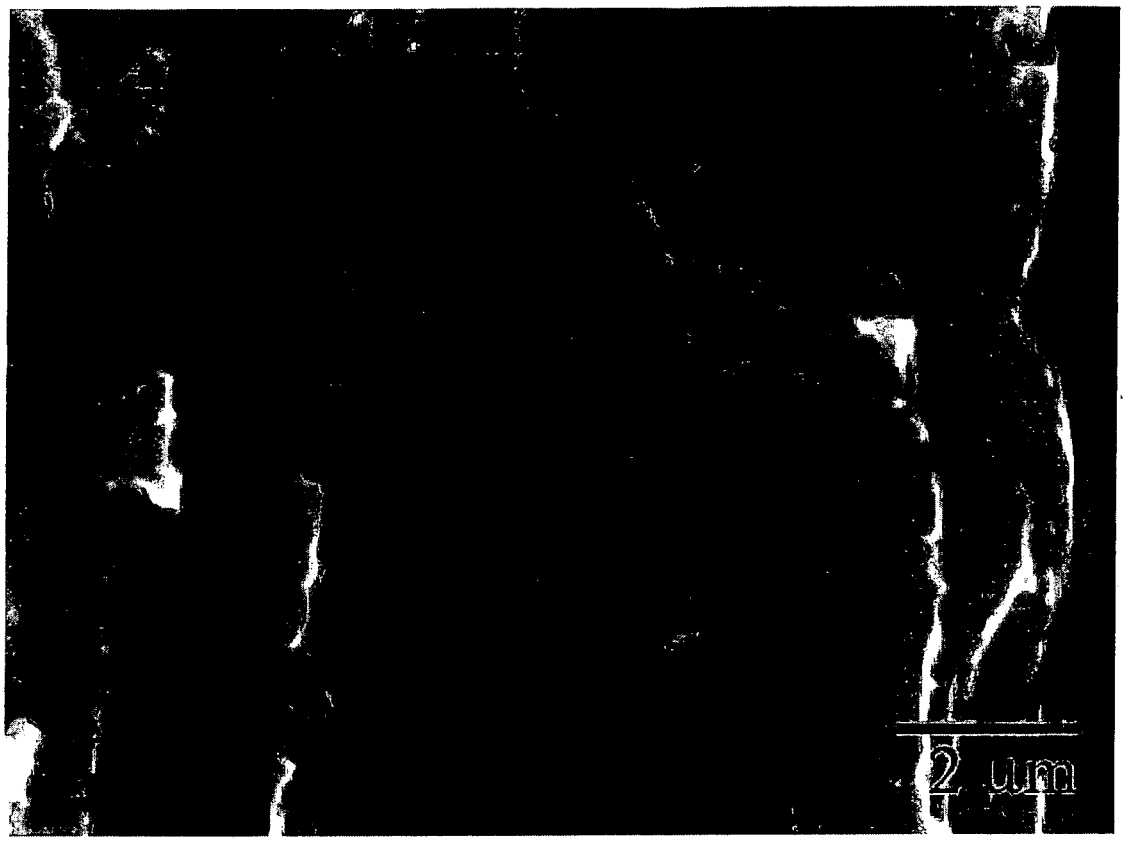
FIG. 27 illustrates a fracture surface of a phenyl POSS-triol/Sn—Ag solder joint at high magnification. The bar represents two micrometers.

FIG. 26 illustrates a fracture surface of phenyl POSS-triol/Sn—Ag solder joints at low magnification. The bar represents ten micrometers. FIG. 27 illustrates a fracture surface of phenyl POSS-triol/Sn—Ag solder joints at high magnification. The bar represents two micrometers.

Figure 28:
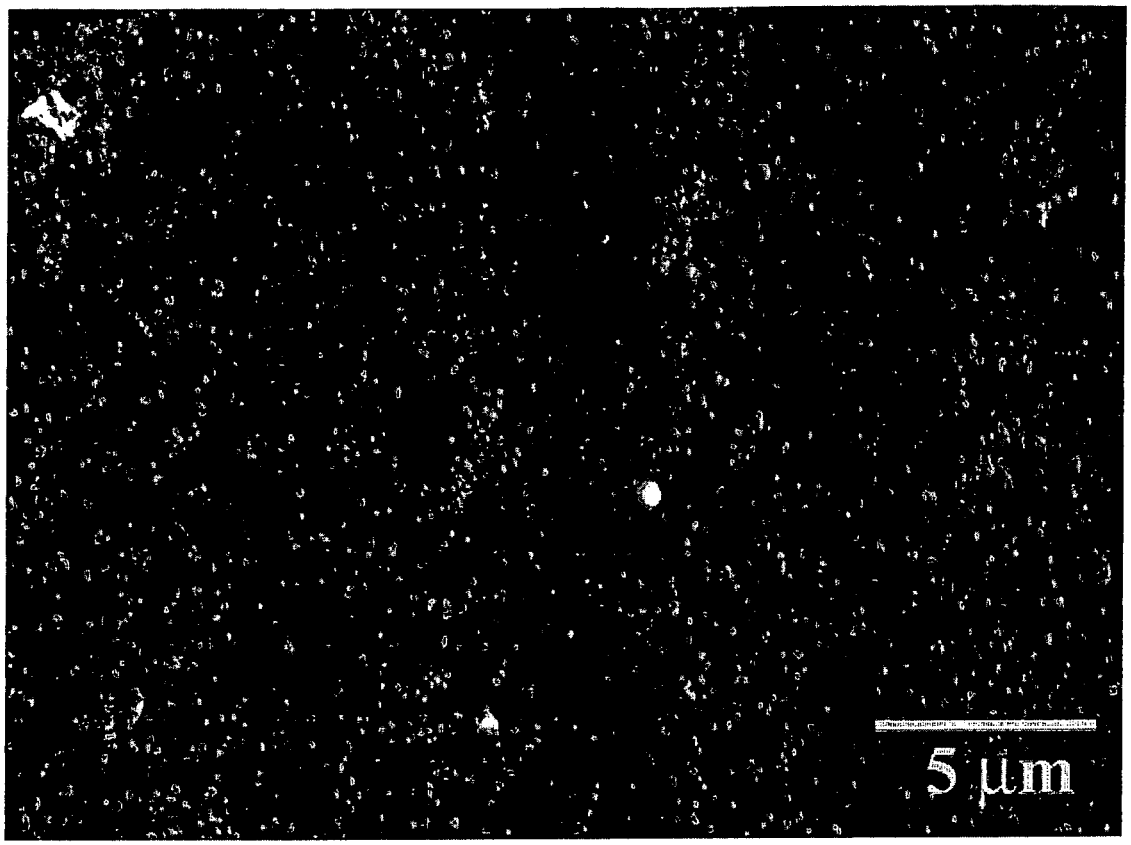
FIG. 28 illustrates an SE image of a polished surface of a phenyl POSS-triol/Sn—Ag solder joint. The bar represents five micrometers.
Figure 29:
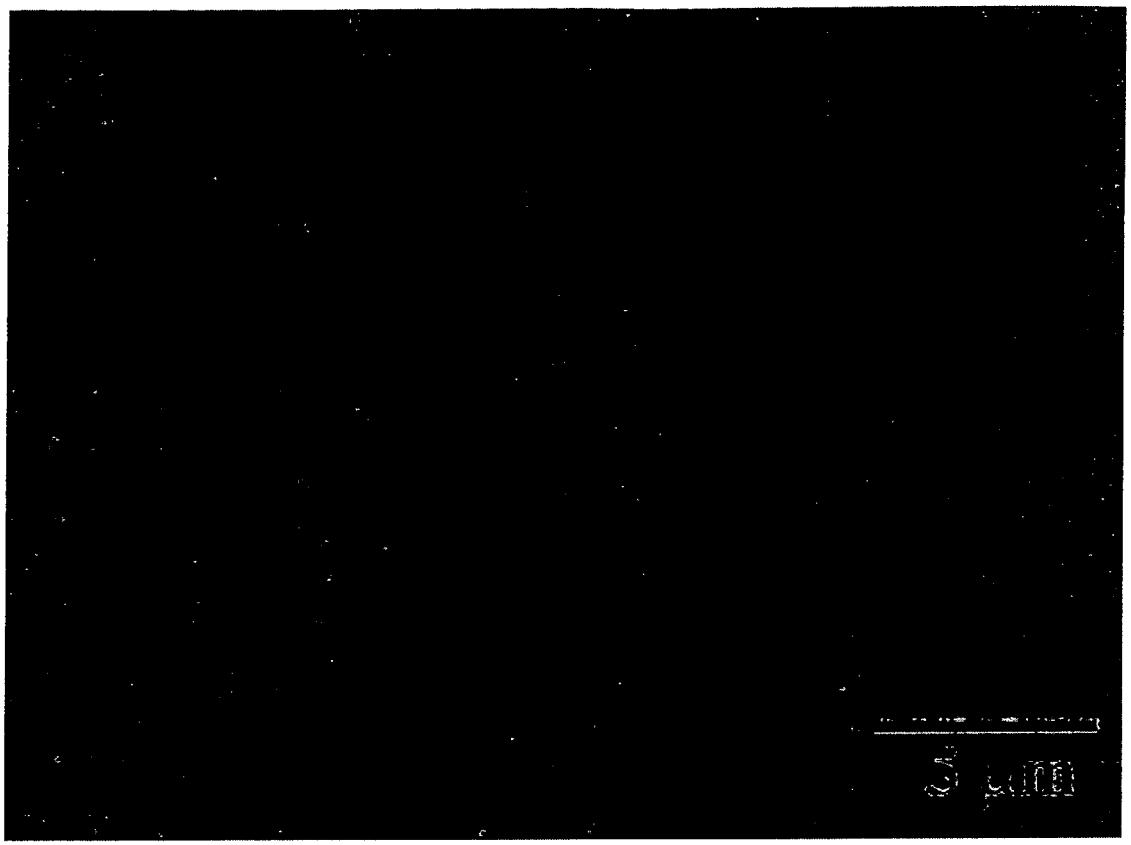
FIG. 29 illustrates a BE image of a polished surface of a phenyl POSS-triol/Sn—Ag solder joint. The bar represents five micrometers.
Figure 30:
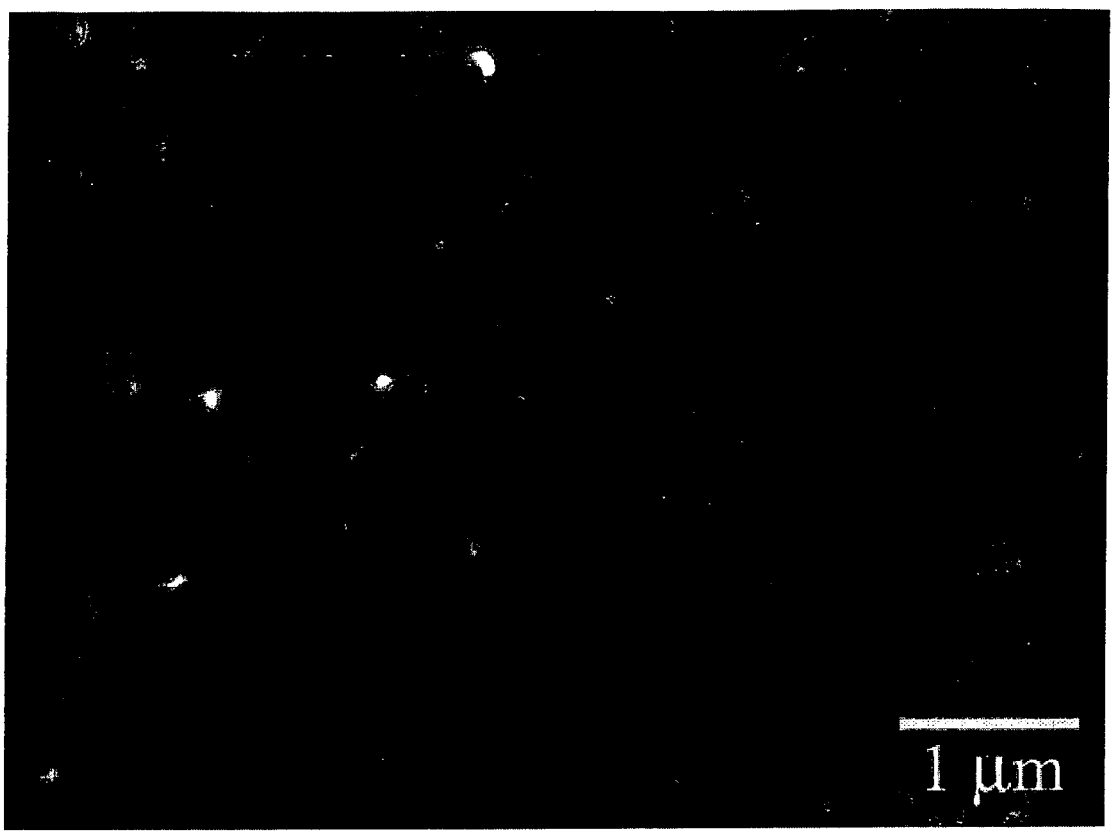
FIG. 30 illustrates a polished surface of a phenyl POSS-triol/Sn—Ag solder joint at high magnification. The bar represents one micrometer.

FIG. 28 illustrates an SE image of a polished surface of phenyl POSS-triol/Sn—Ag solder joints. The bar represents five micrometers. FIG. 29 illustrates a BE image of a polished surface of phenyl POSS-triol/Sn—Ag solder joints. The bar represents five micrometers. FIG. 30 illustrates a polished surface of phenyl POSS-triol/Sn—Ag solder joints at high magnification. The bar represents one micrometer. FIG. 31 illustrates the simple shear strength of eutectic Sn—Ag and the phenyl POSS-triol composite.

TABLE 2

|  |  | Temperature at E* = 1 GPa © | E* at 30 C. (Gpa) | inflection temperature |
|---|---|---|---|---|
| Blend |  |  |  |  |
|  | 1 | PMMA + SO1455 (1 wt %) | 104.35 | 3.21 | 104.35 |
|  | 2 | PMMA + SO1455 (2 wt %) | 102.55 | 3.07 | 102.95 |
|  | 3 | PMMA + SO1455 (5 wt %) | 101.21 | 3.21 | 100.42 |
|  | 4 | PMMA + MSO805 (1 wt %) | 102.49 | 2.78 | 104.31 |
|  | 5 | PMMA + MSO805 (5 wt %) | 98.07 | 2.57 | 102.61 |
| Control-powder copolymer | PMMA-Control-powder | 102.1 | 2.61 | 100.21 |
|  | 301 | PM1275.0-15 wt % | 86.13 | 2.39 | 81.02 |
|  | 302 | PM1275.5-20 wt % | 71.08 | 2.76 | 71.08 |
|  | 303 | PM1275.5-10 wt % |  |  |  |
|  | 304 | PM1275.5-20 wt % | 79.94 | 2.5 | 82.34 |

EXAMPLE 5

The following examples show the shear strength of Sn—Ag Solder Joints containing different amounts and chemical moieties of POSS molecules.

Examples of POSS particles to produce composite solder.
Example 5 Cyclohexenyl-triol (2 wt %)
Example 6 Cyclohexenyl-triol (3 wt %)
Example 7 Ethyl-triol (3 wt %)
Example 8 Phenyl-Triol (2 wt %)
Example 9 Phenyl -triol (3 wt %)
Example 10 and 11 Cyclohexyl-diol (2 wt % and 3 wt %) where R hexyl of the formula.

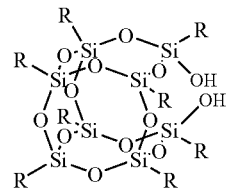

I. Initial Microstructure.

Generally, the POSS containing composite solder joints show very fine size of particles distributed uniformly in solder matrix, irrespective of types of POSS particles. (See FIGS. 35A to 35H below).

II. Single-Shear Lap Test at R.T. (22° C.) with Strain Rate at 0.01 $s^{-1}$

Figure 36:
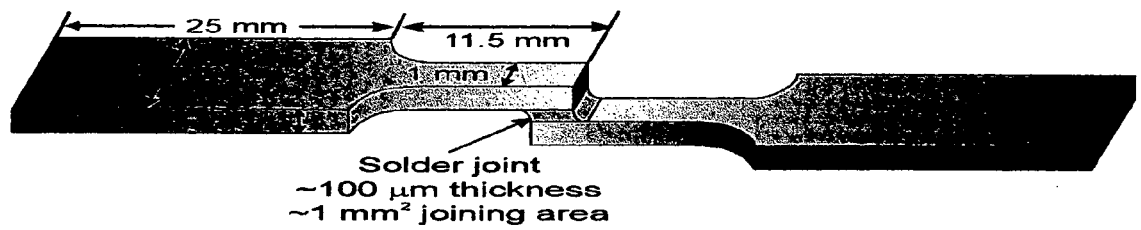
FIG. 36 is an illustration of a single shear lap solder joint.

Single-Shear lap solder joints were fabricated using standard methods previously described and as shown in FIG. 36. Table 3 shows the shear strength of various POSS containing solder joints with a constant strain rate of 0.01 $s^{-1}$ at room temperature.

(Note: All POSS containing solder joints used eutectic Sn—Ag solder paste to produce single-shear lap solder joints.)

TABLE 3

|  | Types of POSS used | Shear Strength (MPa) |
|---|---|---|
| Prior Art | No POSS (eutectic Sn—Ag) | 42 4 |
| Example 5 | 2 wt % Cyclohexenyl-triol | 58 5 |

TABLE 3-continued

|  | Types of POSS used | Shear Strength (MPa) |
|---|---|---|
| Example 6 | 3 wt % Cyclohexenyl-triol | 60 2 |
| Example 8 | 2 wt % Phenyl-triol | 60 3 |
| Example 9 | 3 wt % Phenyl-triol | 61 4 |
| Example 7 | 3 wt % Ethyl-triol | 60 2 |
| Example 10 | 2 wt % Cyclohexyl-diol | 64 3 |
| Example 11 | 3 wt % Cyclohexyl-diol | 62 4 |

Figure 37:
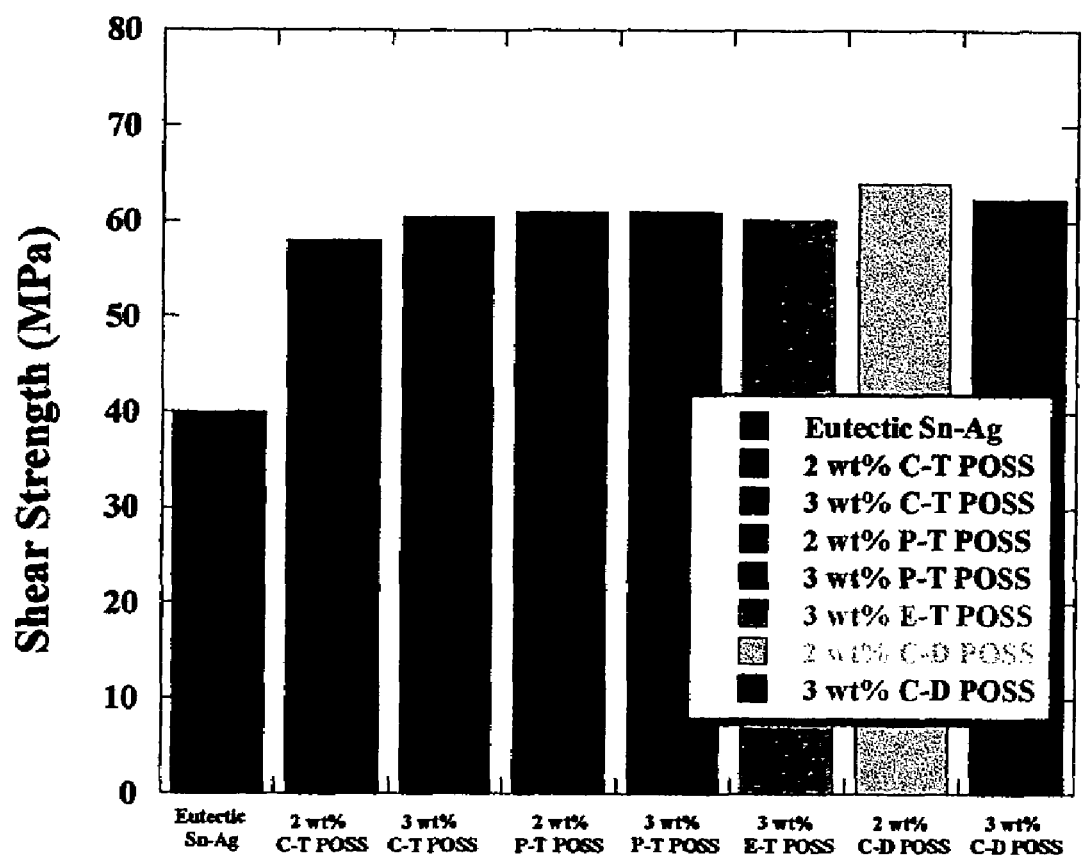
FIG. 37 is a graph showing shear strength of eutectic Sn—Ag and various composite solder joints shear tested at room temperature with strain rate at 0.01 s$^{-1}$.

FIG. 37 shows the results in graph form.

III. Shear test at 85° C. with strain rate at 0 $s^{-1}$

Table 4 shows shear strength of various POSS containing solder joints with a constant strain rate of 0.01 $s^{-1}$ at 85° C.

TABLE 4

|  | Types of POSS used | Shear Strength (MPa) |
|---|---|---|
| Prior Art | No POSS (eutectic Sn—Ag) | 28 |
| Example 5 | 2 wt % Cyclohexenyl-triol | 35 2 |
| Example 8 | 3 wt % Phenyl-triol | 34 4 |
| Example 7 | 3 wt % Ethyl-triol | 36 4 |
| Example 10 | 2 wt % Cyclohexyl-diol | 32 3 |

Figure 38:
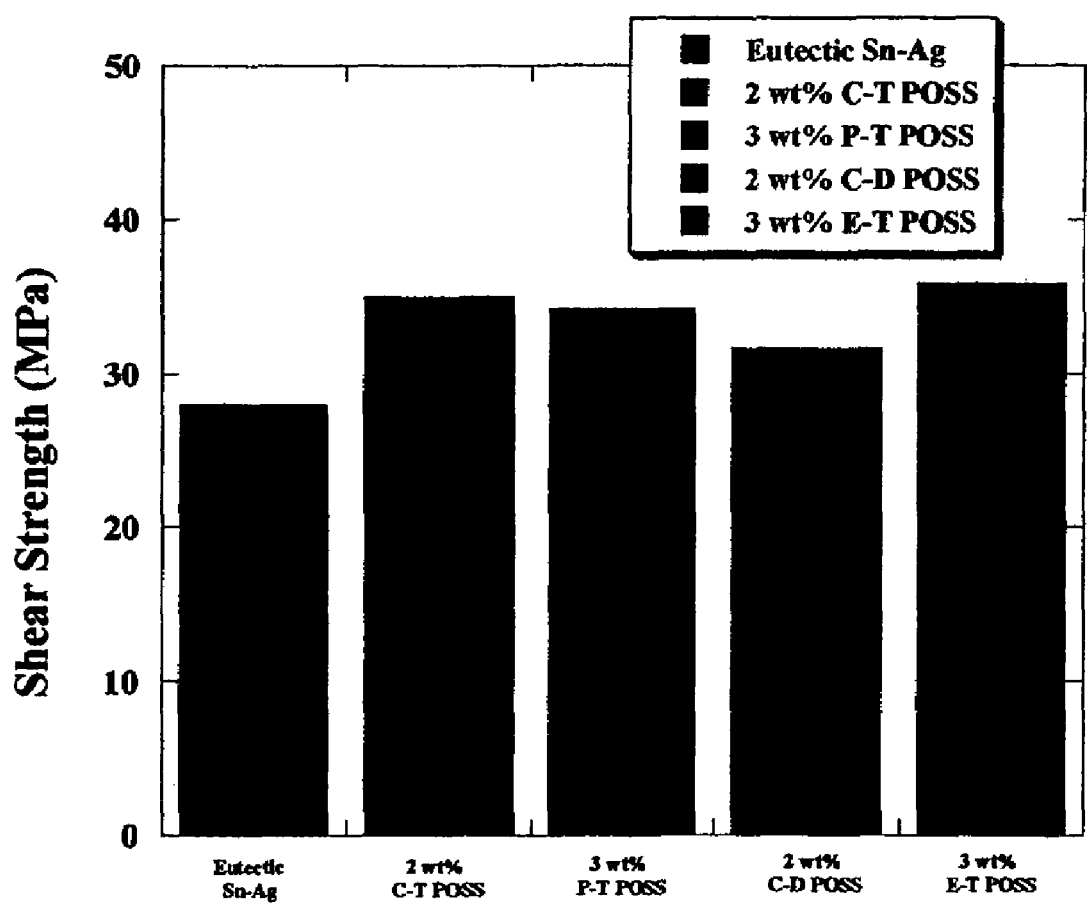
FIG. 38 is a graph showing shear strength of eutectic Sn—Ag and various composite solder joints shear tested at 85° C. with strain rate at 0.01 s$^{-1}$.

FIG. 38 shows the results in graph form.

IV. Shear test at 150° C. with strain rate at 0.01 $s^{-1}$

Table 5 shows shear strength of various POSS containing solder joints with a constant strain rate of 0.01 $s^{-1}$ at 150° C.

TABLE 5

|  | Types of POSS used | Shear Strength (MPa) |
|---|---|---|
| Prior Art | No POSS (eutectic Sn—Ag) | 22 |
| Example 6 | 3 wt % Cyclohexenyl-triol | 28 4 |

TABLE 5-continued

| | Types of POSS used | Shear Strength (MPa) |
|---|---|---|
| Example 9 | 3 wt % Phenyl-triol | 25 1 |
| Example 8 | 3 wt % Ethyl-triol | 26 2 |
| Example 11 | 3 wt % Cyclohexyl-diol | 25 2 |

Figure 39:
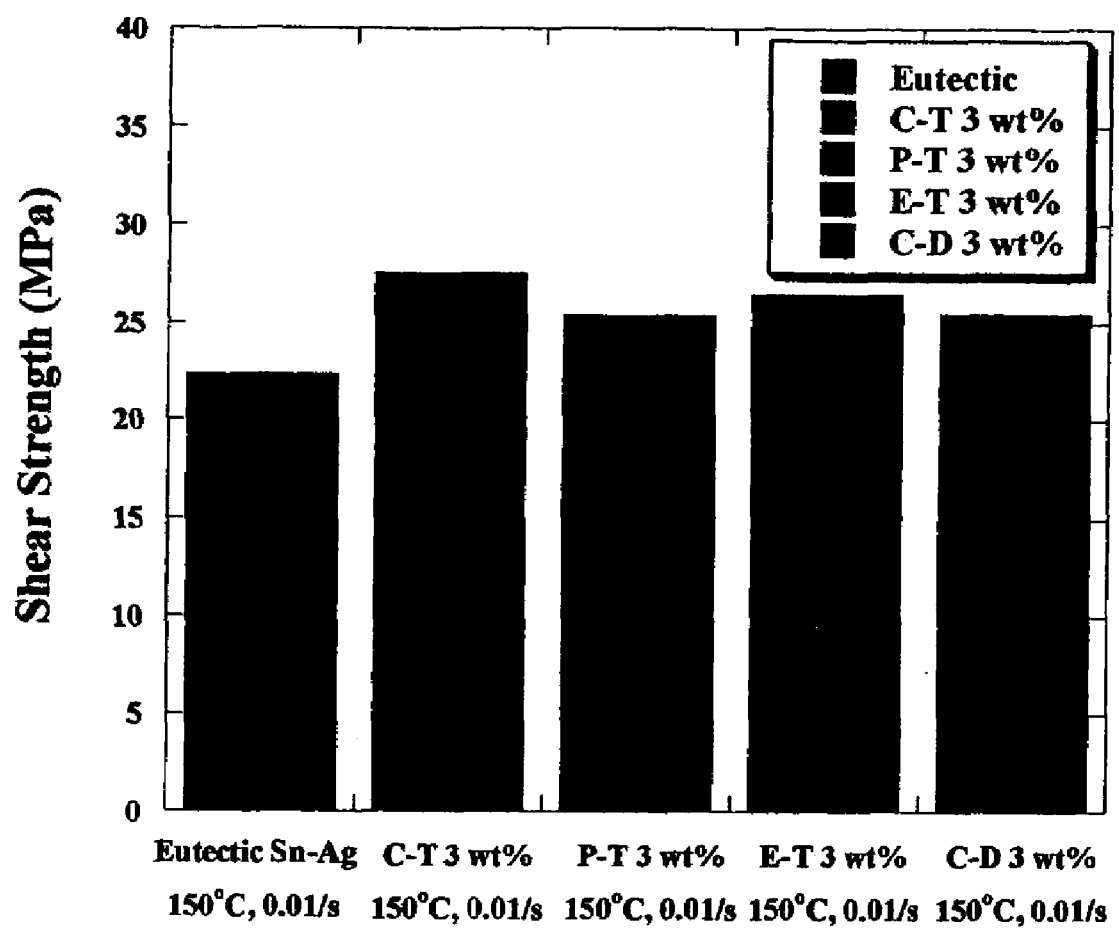
FIG. 39 is a graph showing shear strength of eutectic Sn—Ag and various composite solder joints shear tested at 150° C. with strain rate at 0.01 s$^{-1}$.

FIG. 39 shows the results in graph form.

V. Shear test at RT (22° C.) with strain rate at 0.001 s$^{-1}$

Table 6 shows shear strength of various POSS containing solder joints with a constant strain rate 0.001 s$^{-1}$ at room temperature.

TABLE 6

| | Types of POSS used | Shear Strength (MPa) |
|---|---|---|
| Prior Art | No POSS (eutectic Sn—Ag) | 42 |
| Example 6 | 3 wt % Cyclohexenyl-triol | 51 2 |
| Example 8 | 2 wt % Phenyl-triol | 50 3 |
| Example 7 | 3 wt % Ethyl-triol | 52 1 |

Figure 40:
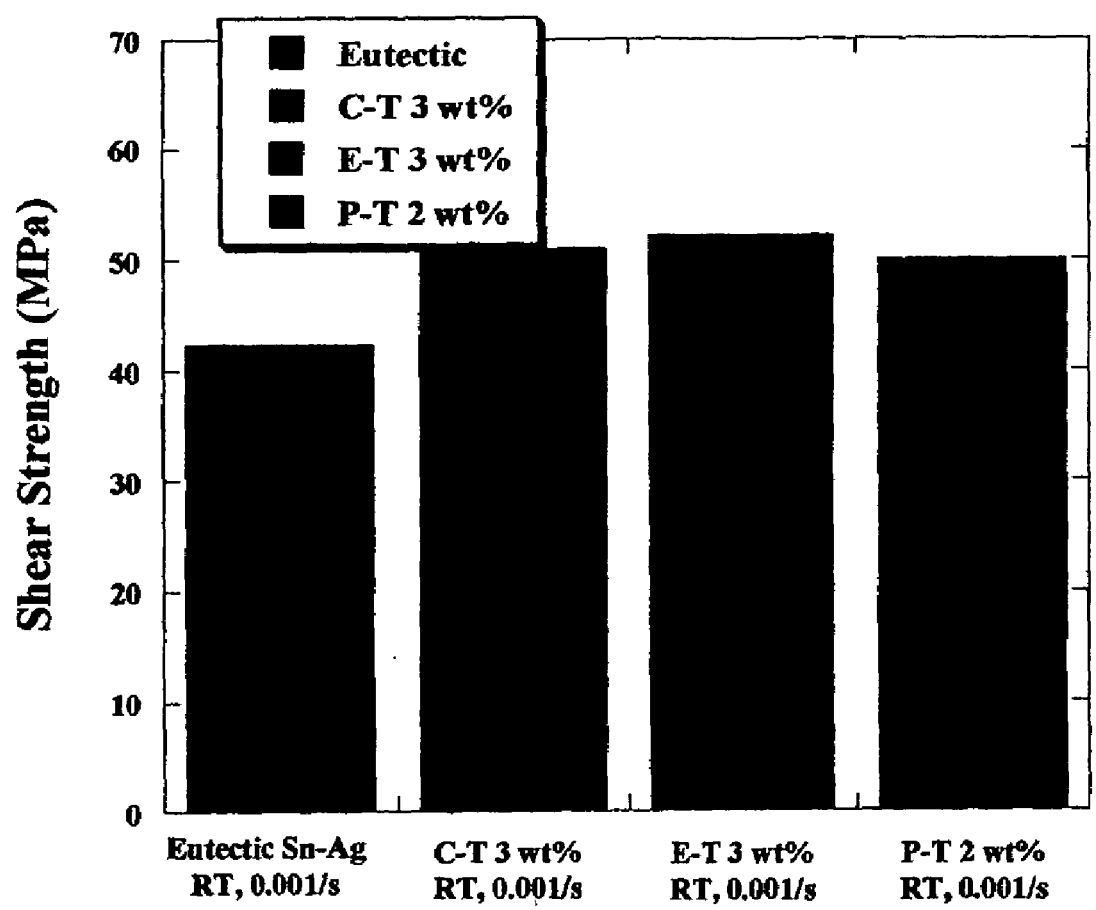
FIG. 40 is a graph showing shear strength of eutectic Sn—Ag and various composite solder joints shear tested at room temperature with strain rate at 0.001/s.

FIG. 40 shows the results in graph form.

Irrespective to the types and the amounts of POSS used, POSS containing eutectic Sn—Ag solder joints exhibited an improved shear strength over the un-reinforced eutectic Sn—Ag solder joints at different temperature and strain rate.

Figure 42A:
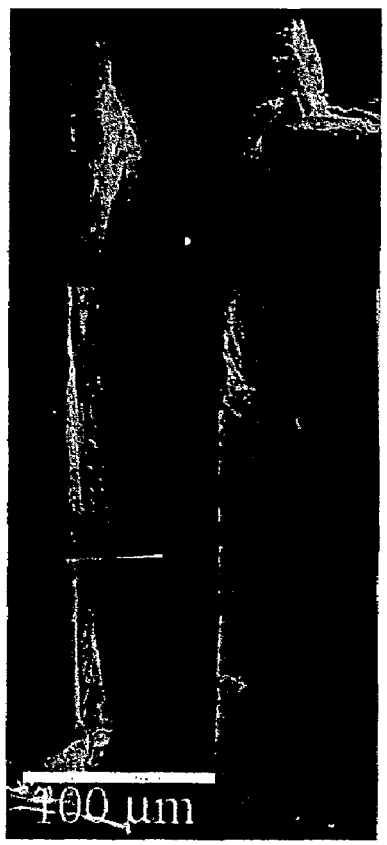
FIGS. 42A and 42B are SEM images of shear failed specimens: 42A eutectic Sn—Ag solder joint, 42B POSS containing composite solder joint.
Figure 42B:
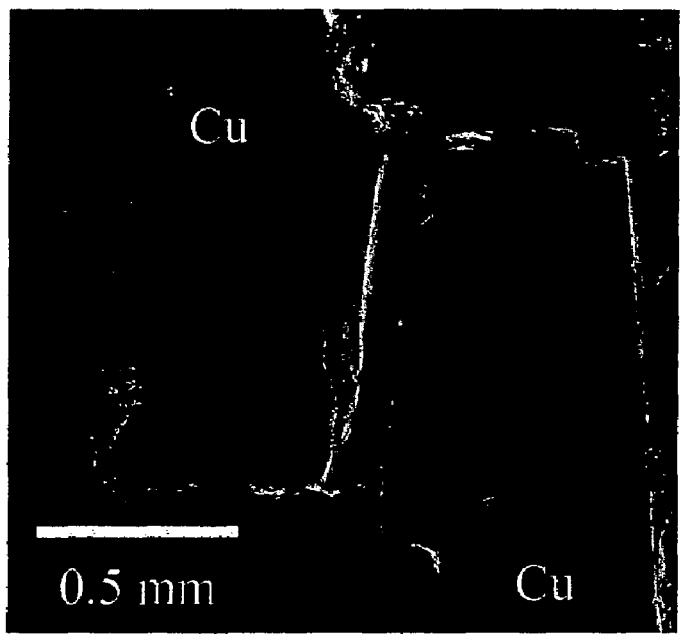

Fracture Morphology of Joints made with POSS containing eutectic Sn—Ag solder joints exhibit a homogenous deformation while un-reinforced joints show a localized deformation as illustrated in FIGS. 41A and 41B and shown in FIGS. 42A and 42B.

Comparison of Eutectic Sn—Ag and POSS Containing Solder Joints upon Exposure to Thermo-mechanical Fatigue (TMF).

Figure 43:
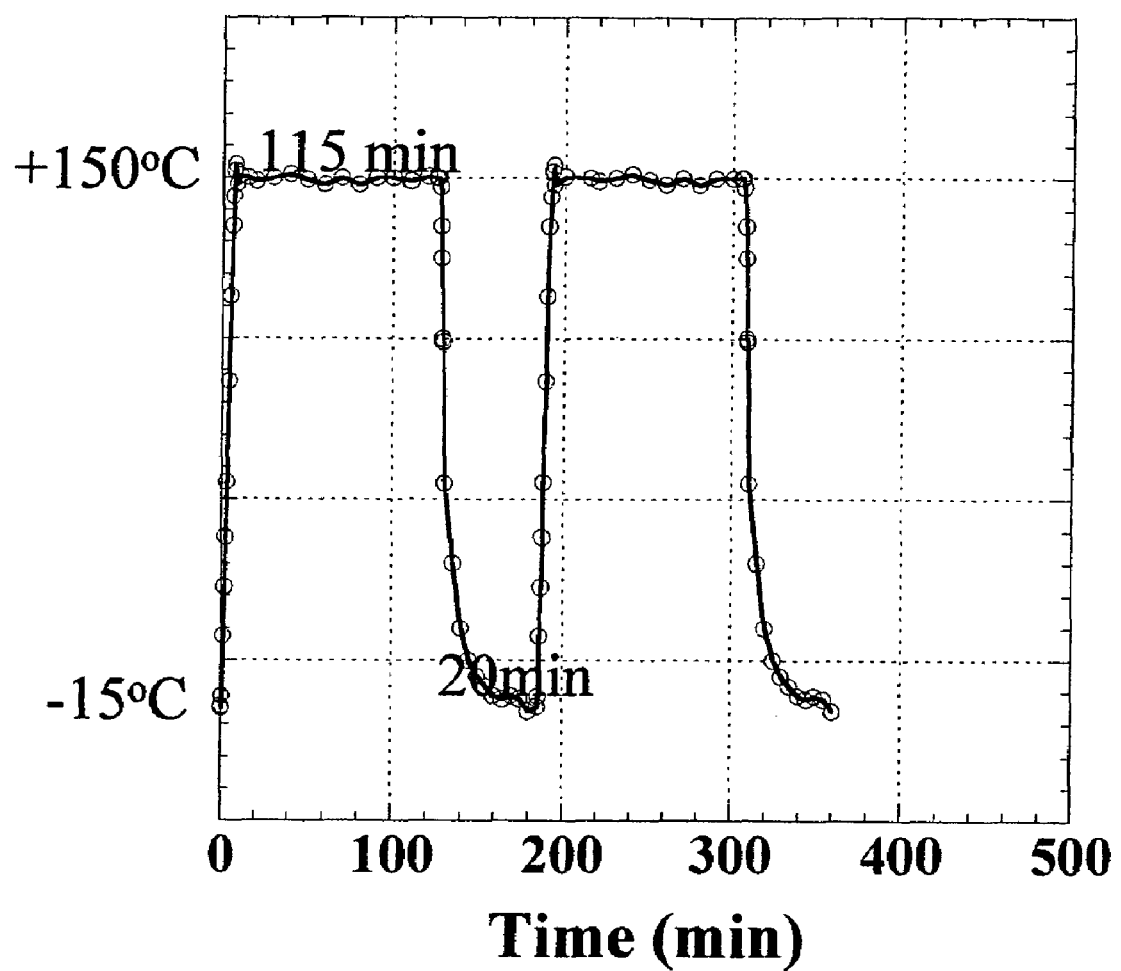
FIG. 43 is a graph showing temperature-time profile for TMF.

Solder joints are to be used in various thermal environments. As a part of this evaluation, solder joints were exposed to realistic thermal cycling condition as shown in FIG. 43. Surface damages at different exposure time were monitored using SEM. Upon exposure to 1000 thermal cycles, joints were tested in standard shear condition to evaluate the residual strength. For TMF testing, eutectic Sn—Ag solder containing two different weight fractions of Cyclohexenyl-POSS triol were used. The joint configuration was as shown in FIG. 36. The geometry of solder joint was a dog-bone shaped single shear lap solder joint.

I. Surface Damage Accumulation

As can be seen in FIGS. 44A to 44D, significant progress of surface damages were observed in eutectic Sn—Ag solder joint with increasing number of TMF cycles.

Composite solder joints containing POSS particles exhibited much less surface damage even after 1000 TMF cycles as can be seen in FIGS. 45A to 45D and 46A to 46D.

After a maximum 1000 TMF cycles, eutectic Sn—Ag solder joints exhibits a highly localized surface deformation near the intermetallic compound (IMC) layer in the solder area as can be noted in FIG. 47A. Surface damage observed in eutectic Sn—Ag solder joints (FIGS. 47B and 47C) is due to coefficient of thermal expansion (CTE) mismatches between Cu substrate and solder. Because Sn (tin) is highly anisotropic material (Body-centered tetragonal), anisotropy of tin also plays significant role to produce surface damage in eutectic Sn—Ag solder joints.

However, surface damage in composite solder joints containing POSS particles were much less as compared to damage accumulation in eutectic Sn—Ag solder joints and the deformation were much more homogeneous throughout the solder joint area as illustrated in FIGS. 47A and 47B.

II. Residual Strength

Figure 48:
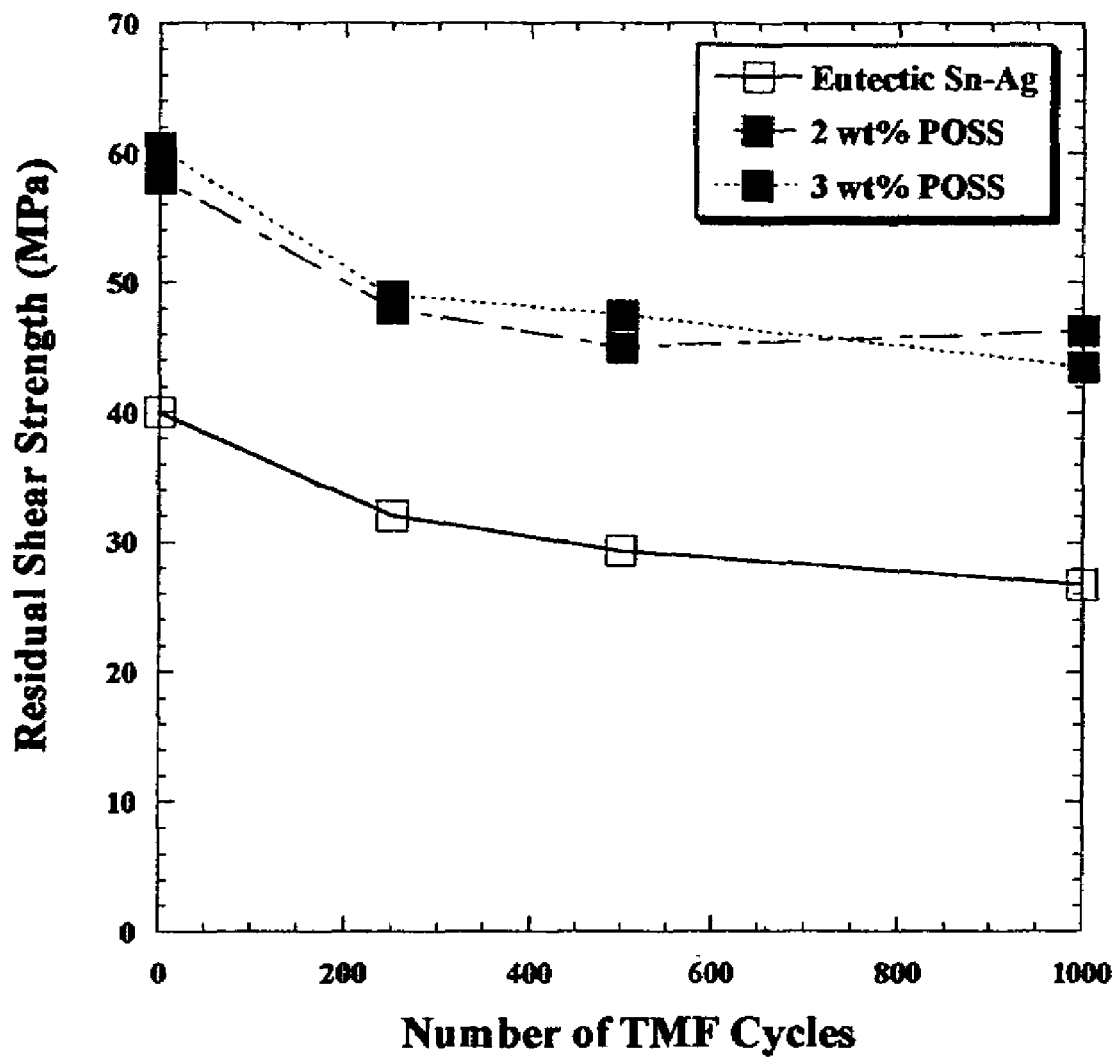
FIG. 48 is a graph showing residual shear-strength of eutectic Sn—Ag and POSS (Cyclohexenyl-triol) containing solder joints after TMF.

Initially, POSS increases the strength of the solder joint (see Table 7 and FIG. 48)

Table 7 shows residual shear strength of POSS (Cyclohexenyl-triol) containing solder joints after TMF. (tested at RT with a constant strain rate of 0.01 s$^{-1}$)

TABLE 7

| # of TMF cycles | Shear strength of eutectic Sn—Ag (MPa) | Shear strength of 2 wt % POSS (MPa) | Shear strength of 3 wt % POSS (MPa) |
|---|---|---|---|
| 0 | 40 | 58 | 60 |
| 250 | 32 | 48 | 49 |
| 500 | 29 | 45 | 48 |
| 1000 | 26 | 46 | 43 |

Figure 49A:
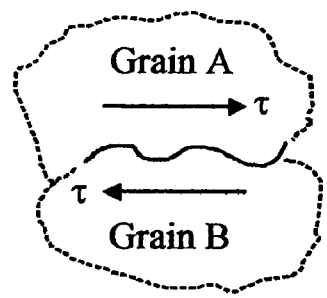
FIGS. 49A to 49C are schematic details of grain boundary sliding due to shear forces applied at high temperature. 49A grain boundary sliding between two adjacent grains with no obstacles, 49B grains undergo lattice deformation due to presence of an intermetallic particle on the grain boundary during grain boundary sliding, and 49C sliding at grain boundary triple point showing location of lattice deformation. Note: The obstacle increases the resistance to sliding, thus plastic deformation.
Figure 49B:
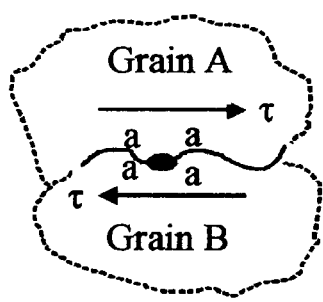
Figure 49C:
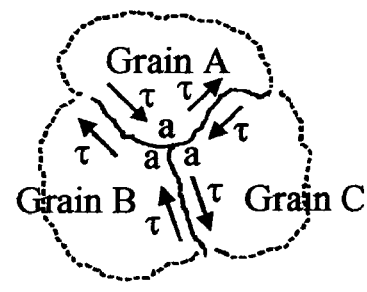

The observed improved shear strength and service performance are believed to be related to the pinning of the grain boundary sliding by the use of nano-particles. It is important to point out here the nano-particles used must be inert such that the size of nano-reinforcement remain unchanged during the service life-time of solder joints. They can be seen from FIGS. 49A, 49B and 49C.

III. Significant Finding after TMF

POSS increases the strength of the solder joint. TMF results in minimal uniform surface damage in POSS containing solder joints, while significant localized damage near solder/substrate interface occurs in joints made with solder containing no POSS under similar conditions.

Even after 1000 TMF cycles the drop in residual strength is minimal in joints made with POSS containing solders (less than 20%), as compared to significant loss of properties of joints made with solders that have no POSS reinforcement (40 to 50%).

Residual strength after TMF of joints made with POSS containing solders are much higher than those made with solders that have no POSS reinforcements.

Summary of findings with lead-free POSS composite solders.

POSS reinforcements can be mechanically mixed to the commercial solder pastes.

They are uniformly distributed through out the solder joint without any noticeable micron size agglomeration.

POSS reinforcements present in the joint tend to exist at Sn grain boundaries. Such a feature is extremely important to prevent grain boundary sliding, a process that contributes to thermomechanical fatigue (TMF) damage of solder joints.

Presence of POSS stabilizes the microstructure. Even after about 2000 hours at 150° C. resulting from 1000 TMF cycles no significant microstructural changes can be noted. No grain growth can be noted in solders reinforced with POSS.

POSS particles are extremely stable under TMF conditions. They do not exhibit any coarsening like intermetallic (IMC) reinforcements introduced by in-situ or mechanical means.

Addition of POSS decreases the wetting angle between eutectic Sn—Ag solder and copper substrates.

Addition of 2 to 3 weight percent POSS increases the shear strength of eutectic Sn—Ag solder by about 50% without significantly affecting its ductility in room temperature studies.

Addition of more than 3 weight percent POSS decreases the wettability of solder on copper substrate.

Addition of 3 weight percent POSS to eutectic Sn—Ag solder corresponds to about 15 volume percent reinforcement. Increasing the addition of POSS increases the wetting angle and thereby decreases the solderability. Studies on composite solder suggest that 15 to 20 volume percent reinforcements is optimal for property and solderability considerations.

POSS reinforcements are nano size particles that are extremely well bonded to the solder. Even after 1000 thermal cycles between −15° C. and 150° C. with dwell times at the temperature extremes, POSS reinforcements do not dislodge from the solder matrix. Such features indicate very strong bond between POSS and solder.

Although SAC (Sn-4 Ag-0.5Cu) solder joint is stronger than eutectic Sn—Ag solder joint in the as-joined configuration, it deteriorates much faster than the eutectic solder under TMF conditions.

TMF performance of POSS reinforced eutectic Sn—Ag solder joint is far superior to that of SAC (Sn-4 Ag-0.5Cu) alloy solder joint under realistic TMF conditions.

Even after 1000 cycles of TMF, POSS reinforced solder joint does not exhibit significant surface damage. Minimal damage noticed under such conditions is distributed more uniformly on the solder joint surface. Lack of extensive localized damage in the solder near the solder/substrate IMC interface under such conditions is vital for the enhanced TMF performance.

Unlike the reinforcements present in in-situ composite solders that are weakly bonded to the solder, POSS reinforcements are very strongly bonded to the solder.

Strong bonding of the POSS reinforcements to the solder, its nano size, size stability without any coarsening or coalescence, and its existence at the grain boundaries are believed to be the main contributors to the enhanced performance of POSS reinforced solder joints, as compared to other composite solders.

Means to incorporate POSS into solder, for applications utilizing wave soldering, preforms can be used.

The POSS does not detract from the electrical characteristics of the solder.

Table 8 shows the electrical conductivity of the eutectic Sn—Ag and POSS (3 wt % cyclohenyl-triol) containing joints.

TABLE 8

| Materials | Electrical Conductivity $(\mu\Omega \cdot cm)^{-1}$ |
| --- | --- |
| Eutectic Sn—Ag solder joint | ~0.12 $(\mu\Omega \cdot cm)^{-1}$ |
| POSS containing composite solder joint | ~0.11 $(\mu\Omega \cdot cm)^{-1}$ |
| Bulk Sn—Ag | ~0.13 $(\mu\Omega \cdot cm)^{-1}$ |
| Pure bulk Sn | ~0.09 $(\mu\Omega \cdot cm)^{-1}$ |

The presence of the POSS had little effect on the electrical conductivity of the solder.

Figure 50:
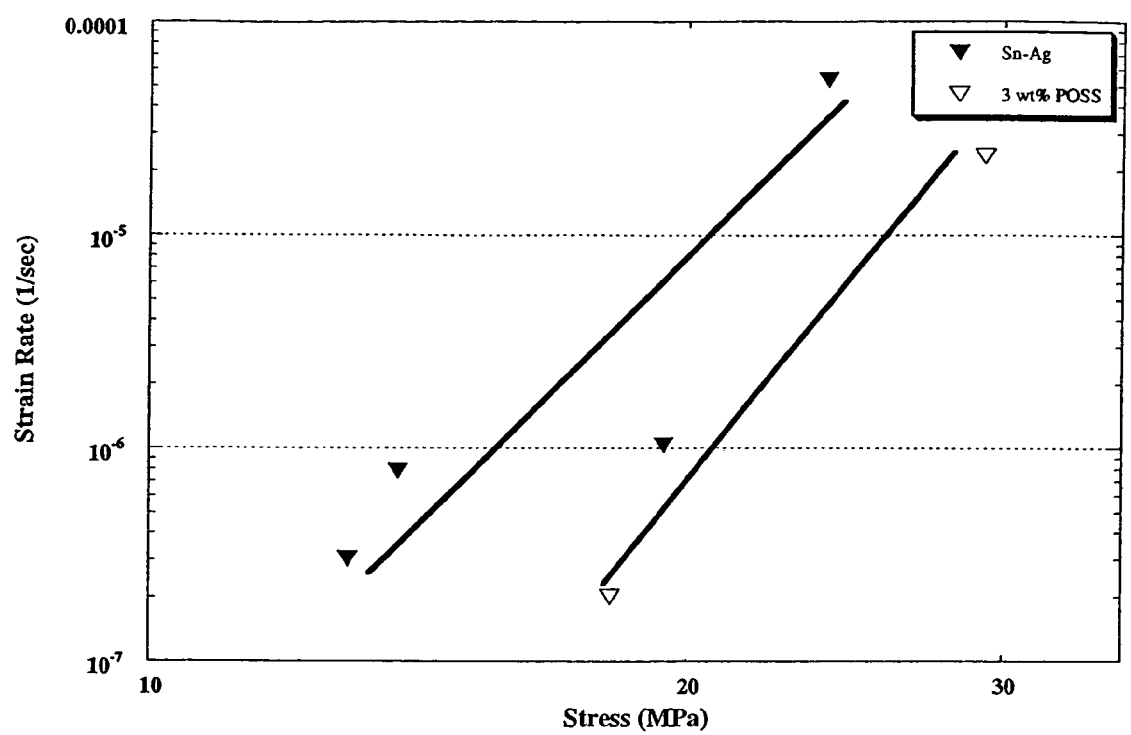
FIG. 50 is a graph showing creep at room temperature for a Sn—Ag eutectic solder with and without POSS.

FIG. 50 is a graph showing creep at room temperature of solder with 3 wt percent POSS (open cleaved) compared to eutectic Sn—Ag solder joints (dashed diamond). It is clear that the POSS improves the creep resistance with this solder which is at 0.8 of its melting point at room temperature.

While the present invention is described herein with reference to illustrated embodiments, it should be understood that the invention is not limited hereto. Those having ordinary skill in the art and access to the teachings herein will recognize additional modifications and embodiments within the scope thereof. Therefore, the present invention is limited only by the Claims attached herein.

We claim:

1. A composite composition comprising:
(a) a metal solder; and
(b) inorganic oxide particles dispersed in the solder, wherein the particles comprise (i) a silanol group and (ii) a chemically bound organofunctional group on a surface of the particles;
wherein the solder is in the form of a solid preform matrix and the particles are dispersed in the solid preform matrix.

2. The composition of claim 1 wherein the solder melts at less than about 250° C.

3. The composition of claim 1 wherein the solder is an alloy of metals.

4. The composition of claim 1, wherein the particles form a chemical bond with the solder.

5. The composition of claim 1, wherein the particles comprise a polyhedral oligomeric silsesquioxane (POSS)-triol with the formula $R_7Si_7O_9(OH)_3$ and the structure:

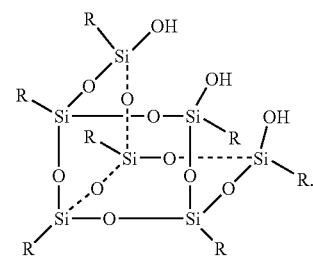

where R is the organofunctional group.

6. The composition of claim 1 wherein the particles comprise a polyhedral oligomeric silsesquioxane (POSS)-triol having cyclohexyl groups as the organofunctional group.

7. The composition of claim 1 wherein the particles comprise a polyhedral oligomeric silsesquioxane (POSS)-triol having phenyl groups as the organofunctional group.

8. The composition of claim 1 wherein the solder comprises a metal selected from the group consisting of tin (Sn), silver (Ag), copper (Cu), bismuth (Si), zinc (Zn), indium (In), gold (Au), nickel (Ni), antimony (Sb), palladium (Pd), platinum (Pt), germanium (Ge), and mixtures thereof.

9. The composition of claim 8 wherein the solder is Sn—Ag.

10. The composition of claim 8 wherein the solder is a eutectic composition comprising 96.5 wt % Sn and 3.5 wt % Ag.

11. A composite composition comprising:
(a) a metal solder; and
(b) inorganic oxide particles dispersed in the solder, wherein the particles comprise (i) a silanol group and (ii) a chemically bound organofunctional group on a surface of the particles, and wherein the particles are selected from the group consisting of polyhedral oligomeric silsesquioxanes (POSS), POSS derivatives, polyhedral oligomeric silicates (POS), POS derivatives, organofunctional silicates, and combinations thereof.

12. The composition of claim 11 wherein the organofunctional group is selected from the group consisting of aliphatic hydrocarbon groups, aromatic hydrocarbon groups, and combinations thereof.

13. The composition of claim 12 wherein the organofunctional group is selected from the group consisting of alkyl, cycloalkyl, alkenyl, cycloalkenyl, alkynyl, cycloalkynyl, aryl, heteroaryl, and combinations thereof.

14. The composition of claim 12 wherein the organofunctional group is selected from the group consisting of hexyl, heptyl, octyl, cyclohexyl, vinyl, allyl, hexenyl, heptenyl, octenyl, phenyl, and combinations thereof.

15. The composition of claim 11 wherein the particles are selected from the group consisting of polyhedral oligomeric silsesquioxanes (POSS), POSS-diols, POSS-triols, and combinations thereof.

16. The composition of claim 11 wherein the particles are selected from the group consisting of polyhedral oligomeric silicates (POS), POS-triols, and combinations thereof.

17. The composition of claim 11 wherein the solder melts at less than about 250° C.

18. The composition of claim 11 wherein the solder is an alloy of metals.

19. The composition of claim 11 wherein the solder is in the form of a paste which can be melted to form a solder matrix with the particles dispersed in the solder matrix.

20. The composition of claim 11 wherein the solder is in the form of a solid preform matrix and the particles are dispersed in the solid preform matrix.

21. The composition of claim 11 wherein the solder is lead-free.

22. The composition of claim 11 wherein the particles form a chemical bond with the solder.

23. The composition of claim 11 wherein the solder comprises a metal selected from the group consisting of tin (Sn), silver (Ag), copper (Cu), bismuth (Bi), zinc (Zn), indium (In), gold (Au), nickel (Ni), antimony (Sb), palladium (Pd), platinum (Pt), germanium (Ge), and mixtures thereof.

24. The composition of claim 23 wherein the solder is Sn—Ag.

25. The composition of claim 23 wherein the solder is a eutectic composition comprising 96.5 wt % Sn and 3.5 wt % Ag.

26. A composite composition comprising:
(a) a lead-free metal solder; and
(b) inorganic oxide particles dispersed in the solder, wherein the particles comprise (i) a silanol group and (ii) a chemically bound organofunctional group on a surface of the particles.

27. The composition of claim 26 wherein the solder melts at less than about 250° C.

28. The composition of claim 26 wherein the solder comprises a metal selected from the group consisting of tin (Sn), silver (Ag), copper (Cu), bismuth (Bi), zinc (Zn), indium (in), gold (Au), nickel (Ni), antimony (Sb), palladium (Pd), platinum (Pt), germanium (Ge), and mixtures thereof.

29. The composition of claim 28 wherein the solder comprises Sn and Ag.

30. The composition of claim 26 wherein the particles form a chemical bond with the solder.

31. The composition of claim 26 wherein the particles comprise a polyhedral oligomeric silsesquioxane (POSS)-triol with the formula $R_7Si_7O_9(OH)_3$ and the structure:

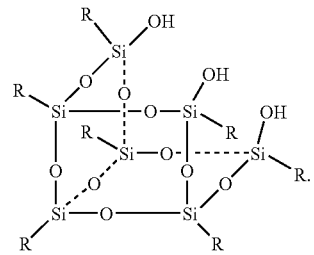

where R is the organofunctional group.

32. The composition of claim 26 wherein the particles comprise one or more of a polyhedral oligomeric silsesquioxane (POSS), a POSS-diol, and a POSS-triol.

33. The composition of claim 26 wherein the particles comprise one or more of a polyhedral oligomeric silicate (POS) and a POS-triol.

34. The composition of claim 26 wherein the organofunctional group is selected from the group consisting of aliphatic hydrocarbon groups, aromatic hydrocarbon groups, and combinations thereof.

35. The composition of claim 34 wherein the organofunctional group is selected from the group consisting of alkyl, cycloalkyl, alkenyl, cycloalkenyl, alkynyl, cycloalkynyl, aryl, heteroaryl, and combinations thereof.

36. The composition of claim 34 wherein the organofunctional group is selected from the group consisting of hexyl, heptyl, octyl, cyclohexyl, vinyl, allyl, hexenyl, heptenyl, octenyl, phenyl and combinations thereof.

37. A composite composition comprising:
(a) a metal solder; and
(b) inorganic oxide particles dispersed in the solder, wherein the particles comprise a polyhedral oligomeric silsesquioxane (POSS)-triol with the formula $R_7Si_7O_9(OH)_3$ and the structure:

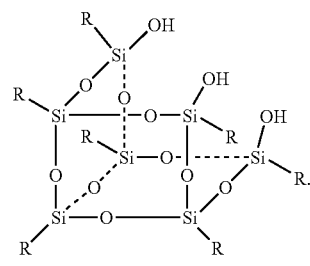

where R is a chemically bound organofunctional group on a surface of the particles.

38. The composition of claim 37 wherein the solder melts at less than about 250° C.

39. The composition of claim 37 wherein the solder is an alloy of metals.

40. The composition of claim 37 wherein the solder is in the form of a paste which can be melted to form a solder matrix with the particles dispersed in the solder matrix.

41. The composition of claim 37 wherein the solder is in the form of a solid preform matrix and the particles are dispersed in the solid preform matrix.

42. The composition of claim 37 wherein the particles form a chemical bond with the solder.

43. The composition of claim 37 wherein the POSS-triol has cyclohexyl groups as the organofunctional group.

44. The composition of claim 37 wherein the POSS-triol has phenyl groups as the organofunctional group.

45. The composition of claim 37 wherein the solder comprises a metal selected from the group consisting of tin (Sn), silver (Ag), copper (Cu), bismuth (Di), zinc (Zn), indium (In), gold (Au), nickel (Ni), antimony (Sb), palladium (Pd), platinum (Pt), germanium (Ge), and mixtures thereof.

46. The composition of claim 45 wherein the solder is Sn—Ag.

47. The composition of claim 45 wherein the solder is a eutectic composition comprising 96.5 wt % Sn and 3.5 wt % Ag.

48. A composite composition comprising:
(a) a metal solder; and
(b) inorganic oxide particles dispersed in the solder, wherein the particles comprise a polyhedral oligomeric silsesquioxane (POSS)-triol having (i) a silanol group and (ii) a chemically bound cyclohexyl group on a surface of the particles.

49. The composition of claim 48 wherein the solder melts at less than about 250° C.

50. The composition of claim 48 wherein the solder is an alloy of metals.

51. The composition of claim 48 wherein the solder is in the form of a paste which can be melted to form a solder matrix with the particles dispersed in the solder matrix.

52. The composition of claim 48 wherein the solder is in the form of a solid preform matrix and the particles are dispersed in the solid preform matrix.

53. The composition of claim 48 wherein the particles form a chemical bond with the solder.

54. The composition of claim 48 wherein the solder comprises a metal selected from the group consisting of tin (Sn), silver (Ag), copper (Cu), bismuth (Si), zinc (Zn), indium (In), gold (Au), nickel (Ni), antimony (Sb), palladium (Pd), platinum (Pt), germanium (Ge), and mixtures thereof.

55. The composition of claim 54 wherein the solder is Sn—Ag.

56. The composition of claim 54 wherein the solder is a eutectic composition comprising 96.5 wt % Sn and 3.5 wt % Ag.

57. A composite composition comprising:
(a) a metal solder; and
(b) inorganic oxide partides dispersed in the solder, wherein the particles comprise a polyhedral oligomeric silsesquioxane (POSS )-trial having (i) a silanol group and (ii) a chemically bound phenyl group on a surface of the particles.

58. The composition of claim 57 wherein the solder melts at less than about 250° C.

59. The composition of claim 57 wherein the solder is an alloy of metals.

60. The composition of claim 57 wherein the solder is in the form of a paste which can be melted to form a solder matrix with the particles dispersed in the solder matrix.

61. The composition of claim 57 wherein the solder is in the form of a solid preform matrix and the particles are dispersed in the solid preform matrix.

62. The composition of claim 57 wherein the particles form a chemical bond with the solder.

63. The composition of claim 57 wherein the solder comprises a metal selected from the group consisting of tin (Sn), silver (Ag), copper (Cu), bismuth (Bi ), zinc (Zn), indium (In), gold (Au), nickel (Ni), antimony (Sb), palladium (Pd), platinum (Pt), germanium (Ge), and mixtures thereof.

64. The composition of claim 63 wherein the solder is Sn—Ag.

65. The composition of claim 63 wherein the solder is a eutectic composition comprising 96.5 wt % Sn and 3.5 wt % Ag.

66. A composite composition comprising:
(a) a eutectic metal solder comprising 95.5 wt % Sn and 3.5 wt % Ag; and
(b) inorganic oxide particles dispersed in the solder, wherein the particles comprise (i) a silanol group and (ii) a chemically bound organofunctional group on a surface of the particles.

67. The composition of claim 66 wherein the solder melts at less than about 250° C.

68. The composition of claim 66 wherein the solder is in the form of a paste which can be melted to form a solder matrix with the particles dispersed in the solder matrix.

69. The composition of claim 66 wherein the solder is in the form of a solid preform matrix and the particles are dispersed in the solid preform matrix.

70. The composition of claim 66 wherein the particles form a chemical bond with the solder.

71. The composition of claim 66 wherein the particles comprise a polyhedral oligomeric silsesquioxane (POSS)-triol with the formula $R_7Si_7O_9(OH)_5$ and the structure:

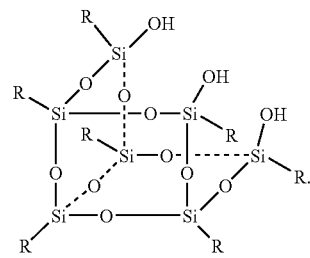

where R is the organofunctional group.

72. The composition of claim 66 wherein the particles comprise a polyhedral oligomeric silsesquiloxane (POSS)-triol having cyclohexyl groups as the organofunctional group.

73. The composition of claim 66 wherein the particles comprise a polyhedral oligomeric silsesquioxane (POSS)-triol having phenyl groups as the organofunctional group.

* * * * *

UNITED STATES PATENT AND TRADEMARK OFFICE
CERTIFICATE OF CORRECTION

PATENT NO. : 7,572,343 B2  Page 1 of 1
APPLICATION NO. : 10/910810
DATED : August 11, 2009
INVENTOR(S) : Andre Y. Lee and Karatholuvu N. Subramanian It is certified that error appears in the above-identified patent and that said Letters Patent is hereby corrected as shown below:

Column 15, line 21, "strength of Sn-Ag" should be --strength of eutectic Sn-Ag--.

Column 20, line 53, Claim 8, "bismuth (Si)" should be --bismuth (Bi)--.

Column 23, line 5, Claim 45, "bismuth (Di)" should be --bismuth (Bi)--.

Column 23, line 35, Claim 54, "bismuth (Si)" should be --bismuth (Bi)--.

Column 24, line 35, Claim 71, "$R_7Si_7O_9(OH)_5$" should be --$R_7Si_7O_9(OH)_3$--.

Signed and Sealed this

Twenty-seventh Day of April, 2010

David J. Kappos
*Director of the United States Patent and Trademark Office*